United States Patent
Majima

(10) Patent No.: US 12,476,633 B2
(45) Date of Patent: Nov. 18, 2025

(54) TRANSISTOR DRIVER CIRCUIT AND TRANSISTOR DRIVING METHOD

(71) Applicants: Kabushiki Kaisha Toshiba, Tokyo (JP); Toshiba Electronic Devices & Storage Corporation, Tokyo (JP)

(72) Inventor: Hideaki Majima, Minato Tokyo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 99 days.

(21) Appl. No.: 18/488,880

(22) Filed: Oct. 17, 2023

(65) Prior Publication Data

US 2024/0128970 A1    Apr. 18, 2024

(30) Foreign Application Priority Data

Oct. 18, 2022   (JP) ................. 2022-166949

(51) Int. Cl.
*H03K 17/284*   (2006.01)

(52) U.S. Cl.
CPC .................. *H03K 17/284* (2013.01)

(58) Field of Classification Search
CPC .................................................. H03K 17/284
See application file for complete search history.

(56) References Cited

U.S. PATENT DOCUMENTS

| | | | | |
|---|---|---|---|---|
| 10,425,080 B1* | 9/2019 | Lam | ................. | H02M 3/33515 |
| 10,873,716 B2* | 12/2020 | Xu | ................. | H04N 25/531 |
| 10,931,201 B2* | 2/2021 | Lu | ................. | H02M 3/158 |
| 11,621,646 B2* | 4/2023 | Zong | ................. | H02M 1/08 |
| | | | | 363/21.14 |
| 11,646,742 B1* | 5/2023 | Huang | ................. | H03L 7/0816 |
| | | | | 375/376 |
| 2015/0264281 A1* | 9/2015 | Yoo | ................. | H04N 25/617 |
| | | | | 327/136 |
| 2016/0218709 A1* | 7/2016 | Inazu | ................. | H03K 17/04123 |
| 2016/0285454 A1* | 9/2016 | Gupta | ................. | H03K 17/102 |
| 2020/0186135 A1* | 6/2020 | Billiot | ................. | H03K 5/131 |
| 2020/0186145 A1* | 6/2020 | Nagai | ................. | H03K 17/163 |
| 2021/0058078 A1* | 2/2021 | Fujita | ................. | H03K 5/1252 |

FOREIGN PATENT DOCUMENTS

| | | |
|---|---|---|
| JP | 2013-027193 A | 2/2013 |
| JP | 2013-070530 A | 4/2013 |
| JP | 2019-054349 A | 4/2019 |
| JP | 2019-146354 A | 8/2019 |
| JP | 2020-036424 A | 3/2020 |

* cited by examiner

*Primary Examiner* — Menatoallah Youssef
*Assistant Examiner* — Khareem E Almo
(74) *Attorney, Agent, or Firm* — Kim & Stewart LLP

(57) ABSTRACT

According to an embodiment, a transistor driver circuit includes a driving force limitation circuit and a delay-time adjustment circuit. The driving force limitation circuit operates to maintain a gate potential of a transistor to be driven at a driving force limitation potential when the transistor to be driven is driven. The driving force limitation potential corresponds to a threshold voltage of the transistor to be driven. The delay-time adjustment circuit operates to cause the gate potential to transition to the driving force limitation potential when the driving force limitation circuit is in operation.

12 Claims, 23 Drawing Sheets

TRANSISTOR DRIVER CIRCUIT AND TRANSISTOR DRIVING METHOD

CROSS-REFERENCE TO RELATED APPLICATIONS

This application is based upon and claims the benefit of priority from Japanese Patent Application No. 2022-166949, filed on Oct. 18, 2022, the entire contents of which are incorporated herein by reference.

FIELD

Embodiments described herein relate generally to a transistor driver circuit and a transistor driving method.

BACKGROUND

A gate driver circuits serving to drive a power transistor has conventionally been known as a kind of transistor driver circuit. In such a gate driver circuit, the driving force is adjusted not to rapidly perform the state transition in the power transistor. For example, the gate driver circuit is configured to take a long time to perform transition of the gate capacitance of the transistor in the final stage of the gate driver circuit to a threshold voltage.

In the configuration above, even before and after the driving force limitation period, the charge flowing into the gate of the transistor in the final stage of the gate driver circuit is limited by a variable current source. Therefore, there arises a problem that the time for raising the potential of the gate to a threshold voltage increases, and the propagation delay time increases.

It has been desired to reduce the propagation delay time and improve the reliability of the transistor driver circuit.

DETAILED DESCRIPTION

According to the present embodiment, a transistor driver circuit includes a driving force limitation circuit and a delay-time adjustment circuit. The driving force limitation is configured to maintain a gate potential of a transistor to be driven at a driving force limitation potential when the transistor to be driven is driven. The driving force limitation potential corresponds to a threshold voltage of the transistor to be driven. The delay-time adjustment circuit is configured to cause the gate potential to transition to the driving force limitation potential when the driving force limitation circuit is in operation.

Embodiments of a transistor driver circuit will be explained below in detail with reference to the accompanying drawings. The present invention is not limited to the following embodiments.

Figure 1:
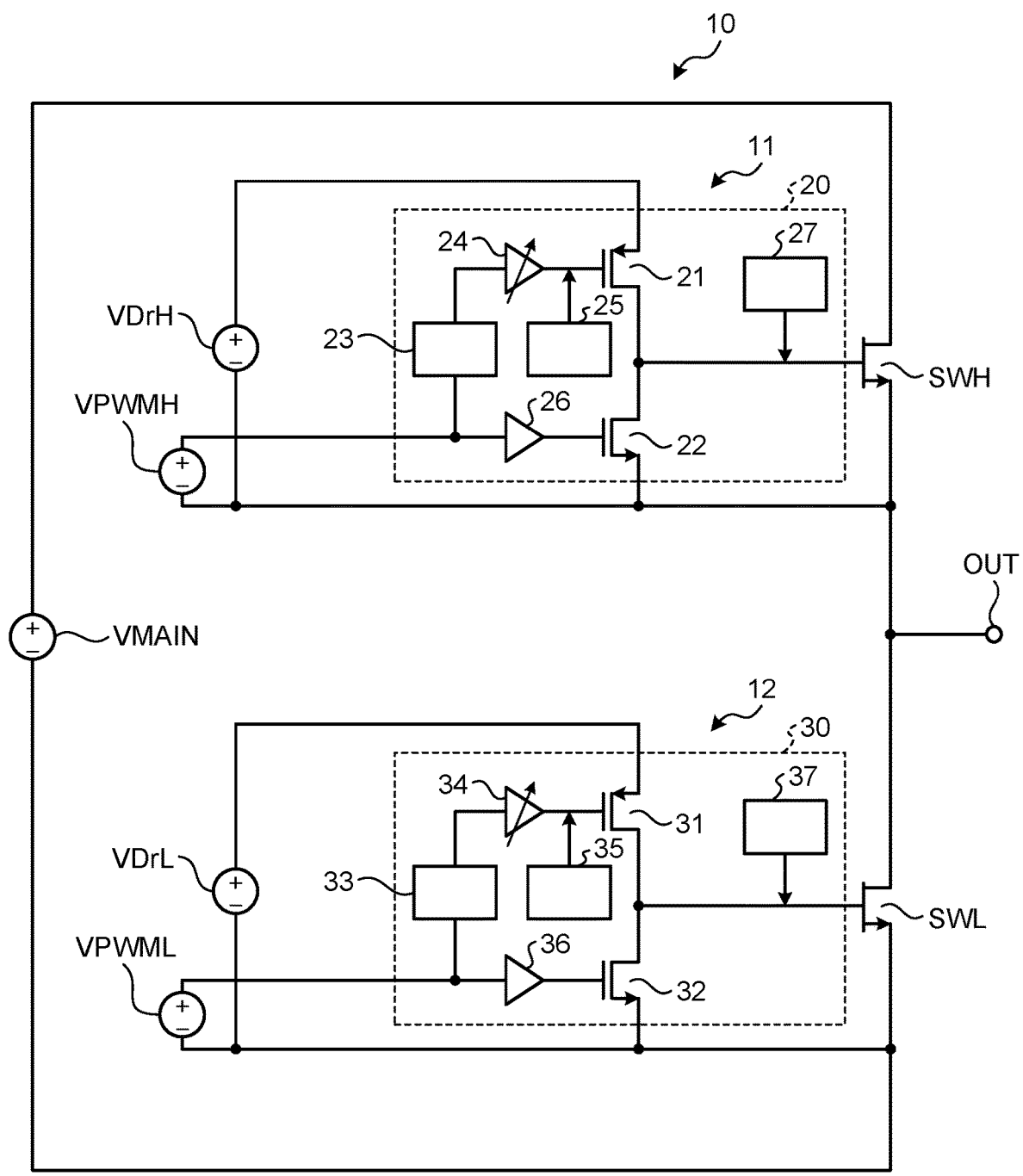
FIG. 1 is a schematic configuration block diagram of a transistor driver circuit according to an embodiment.

FIG. 1 is a schematic configuration block diagram of a transistor driver circuit according to an embodiment. A transistor driver circuit 10 includes a main circuit power supply VMAIN that supplies driving power, a high-potential-side gate driver circuit 11, a low-potential-side gate drive circuit 12, a high-potential-side switch SWH, a low-potential-side switch SWL, and an output terminal OUT.

The transistor driver circuit 10 constitutes a switching circuit that exclusively turns on/off the high-potential-side switch SWH and the low-potential-side switch SWL, and outputs 0 volt and the voltage of the main circuit power supply VMAIN to the output terminal OUT at a desired duty ratio to output a desired output average voltage. In an actual circuit configuration, a predetermined low-pass filter configured by inductance and capacitance is provided at the output terminal OUT to output a smoothed output average voltage.

In the above configuration, the main circuit power supply VMAIN is a power supply corresponding to a high voltage and a large current. The main circuit power supply VMAIN is capable of supplying power of several watts to several tens of kilowatts at a voltage of 100 volts to several kilovolts. The high-potential-side gate driver circuit 11 includes a first PWM power supply VPWMH, a first gate drive power supply VDrH, and a first gate driver IC20.

In the above-described configuration, the first gate drive power supply VDrH and the second gate drive power supply VDrL are so-called isolated power supplies. The first gate drive power supply VDrH and the second gate drive power supply VDrL are configured as floating power supplies whose potential on the low potential side (VSS potential) varies on the basis of the potential of the source terminal of the high-potential-side switch SWH or the low-potential-side switch SWL.

The first gate driver IC20 is a high-potential-side (high-side) gate driver IC. The first gate driver IC20 includes a P-channel MOS transistor 21, an N-channel MOS transistor 22, a first level-shift circuit 23, a first variable amplifier 24, a first delay-time adjustment circuit 25, a first amplifier 26, and a second delay-time adjustment circuit 27.

The P-channel MOS transistor 21 includes a source terminal connected to a high-potential-side output terminal of the first gate drive power supply VDrH, and a drain terminal connected to a gate terminal of the power transistor constituting the high-potential-side switch SWH.

The N-channel MOS transistor 22 forms a CMOS with the P-channel MOS transistor 21. The N-channel MOS transistor 22 includes a drain terminal connected to a gate terminal of the power transistor forming the high-potential-side switch SWH, and a source terminal connected to the low-potential-side output terminal of the first gate drive power supply VDrH.

The first level-shift circuit 23 includes an input terminal connected to a high-potential-side output terminal of the first PWM power supply VPWMH. The first level-shift circuit 23 shifts the voltage level and outputs the shifted voltage level from an output terminal. The first variable amplifier 24 amplifies the voltage level of the first level-shift circuit 23 in a variable manner and outputs the amplified voltage level to a gate terminal of the P-channel MOS transistor 21.

The first delay-time adjustment circuit 25 adjusts the output delay time of the first variable amplifier 24. The first amplifier 26 amplifies the voltage level of the first PWM power supply VPWMH and outputs the amplified voltage level to a gate terminal of the N-channel MOS transistor 22. The second delay-time adjustment circuit 27 adjusts the output delay time of the P-channel MOS transistor 21 or the N-channel MOS transistor 22.

The low-potential-side gate drive circuit 12 includes a second PWM power supply VPWML, a second gate drive power supply VDrL, and a second gate driver IC 30.

The second gate driver IC 30 includes a P-channel MOS transistor 31, an N-channel MOS transistor 32, a second level-shift circuit 33, a second variable amplifier 34, a third delay-time adjustment circuit 35, a second amplifier 36, and a fourth delay-time adjustment circuit 37.

The P-channel MOS transistor 31 is a gate driver IC on a low-potential side (low side). The P-channel MOS transistor 31 includes a source terminal connected to a high-potential-side output terminal of the second gate drive power supply VDrL, and a drain terminal connected to a gate terminal of a power transistor constituting the low-potential-side switch SWL.

The N-channel MOS transistor 32 forms a CMOS with the P-channel MOS transistor 31. The N-channel MOS transistor 32 includes a drain terminal connected to a gate terminal of the power transistor forming the low-potential-side switch SWL, and a source terminal connected to a low-potential-side output terminal of the second gate drive power supply VDrL.

The second level-shift circuit 33 includes an input end connected to a high-potential-side output terminal of the second PWM power supply VPWML. The second level-shift circuit 33 shifts the voltage level and outputs the voltage level from an output end. The second variable amplifier 34 amplifies the voltage level of the second level-shift circuit 33 in a variable manner and outputs the amplified voltage level to a gate terminal of the P-channel MOS transistor 31.

The third delay-time adjustment circuit 35 adjusts the output delay time of the variable amplifier 34. The second amplifier 36 amplifies the voltage level of the second PWM power supply VPWML and outputs the amplified voltage level to a gate terminal of the N-channel MOS transistor 32. The fourth delay-time adjustment circuit 37 adjusts the output delay time of the P-channel MOS transistor 21 or the N-channel MOS transistor 22.

The first PWM power supply VPWMH and the second PWM power supply VPWML are so-called isolators. The first PWM power supply VPWMH and the second PWM power supply VPWML convert a ground reference input PWM signal into a signal based on the potential of a source terminal of the high-potential-side switch SWH and a signal based on the potential of a source terminal of the low-potential-side switch SWL, respectively.

The voltages of the first gate drive power supply VDrH and the second gate drive power supply VDrL are equal to each other in a range of 12 to 18 volts. The voltages of the first PWM power supply VPWMH and the second PWM power supply VPWML are equal to each other in a range of 5 to 18 volts.

Figure 2A:
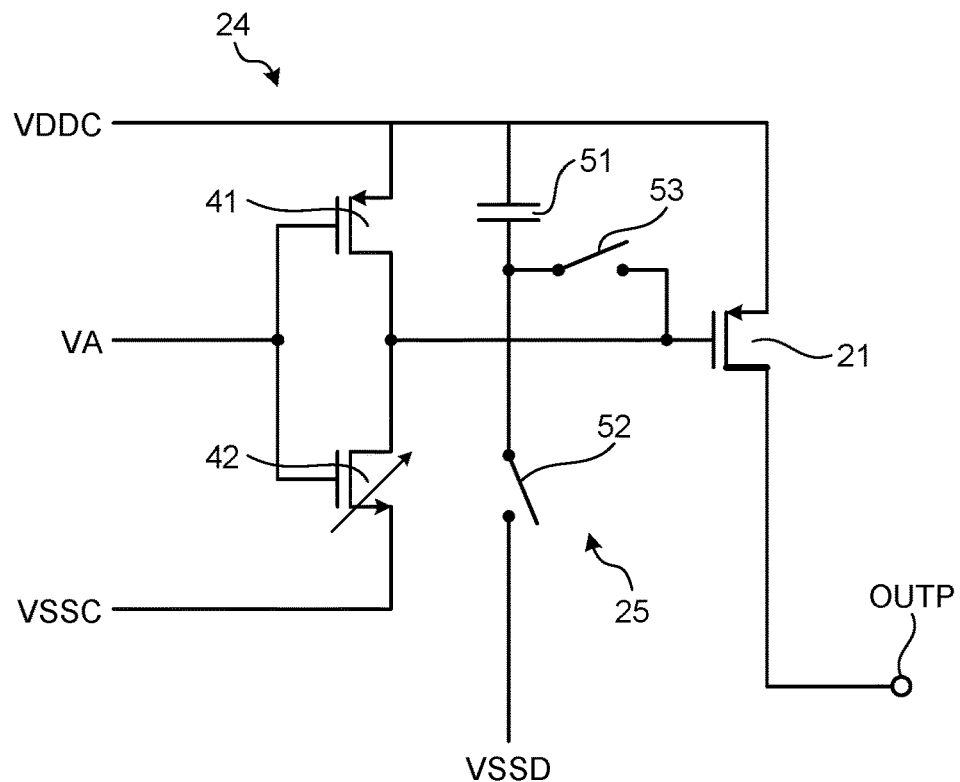
FIG. 2A is a first basic configuration explanatory diagram of the embodiment.

FIG. 2A is a first basic configuration explanatory diagram of the embodiment. In FIG. 2A, the first variable amplifier 24 includes a P-channel MOS transistor 41 and a driving force variable N-channel MOS transistor 42. The P-channel MOS transistor 41 includes a source terminal connected to a high-potential-side power supply VDDC, a drain terminal connected to a gate terminal of the P-channel MOS transistor 21, and a gate terminal to which an output signal VA of the first level-shift circuit 23 is input. The driving force variable N-channel MOS transistor 42 includes a drain terminal connected to a gate terminal of the P-channel MOS transistor 21, a source terminal connected to a low-potential-side power supply VSSC, and a gate terminal to which the output signal VA of the first level-shift circuit 23 is input.

The first delay-time adjustment circuit 25 includes a capacitor 51, a precharge switch 52, and a charge switch 53. In the capacitor 51, one end is connected to the high-potential-side power supply VDDC. In the precharge switch 52, one end is connected to the other end of the capacitor 51, and the other end is connected to the low-potential-side power supply VSSD. In the charge switch 53, one end is connected to the other end of the capacitor 51, and the other end connected to the gate terminal of the P-channel MOS transistor 21.

In the above configuration, the precharge switch 52 is in an ON state in the entire or part of a period during which the output signal VA of the first level-shift circuit 23 is at an "L" level. That is, the precharge switch 52 is in the ON state until the capacitor 51 reaches a predetermined voltage.

The charge switch 53 is in the ON state in the entire or part of a period during which the output signal VA of the first level-shift circuit 23 is at an "H" level. That is, the charge switch 53 is in the ON state until the potential of the gate terminal of the P-channel MOS transistor 21 reaches a predetermined voltage (ideally, the threshold voltage of the P-channel MOS transistor 21).

Figure 2B:
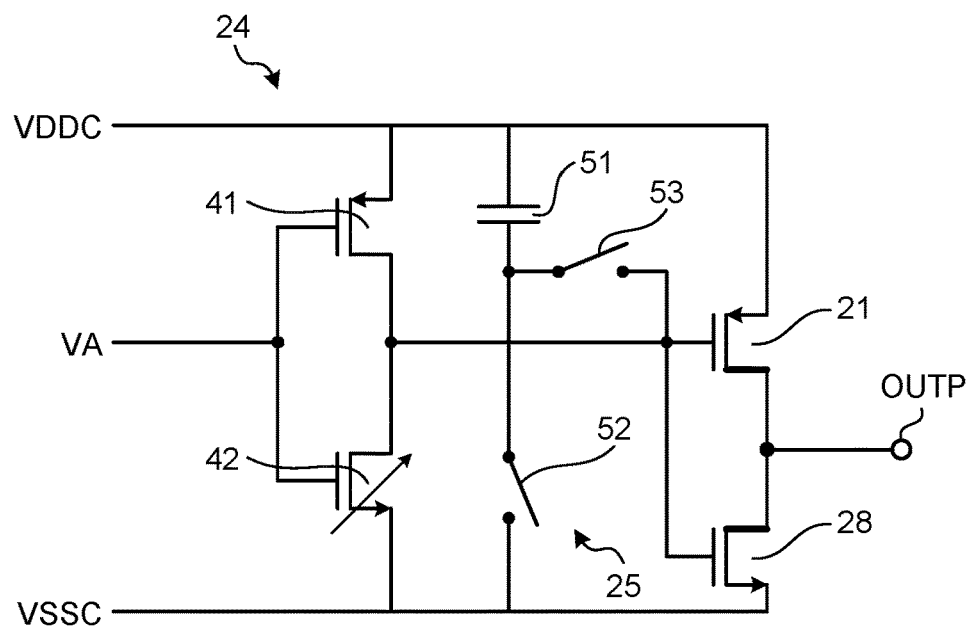
FIG. 2B is an explanatory diagram of a modification of the first basic configuration of the embodiment.

FIG. 2B is an explanatory diagram of a modification of the first basic configuration of the embodiment. The modification of the first basic configuration of the embodiment is different from the first basic configuration of the embodiment of FIG. 2A in that, an N-channel MOS transistor 28 is provided and another end of the precharge switch 52 is connected to the low-potential-side power supply VSSC. In the N-channel MOS transistor 28, a drain terminal is connected to a connection point between a drain terminal of a P-channel MOS transistor 21 and an output terminal OUTP, a source terminal is connected to a low-potential-side power supply VSSC, and a gate terminal is connected to a gate terminal of the P-channel MOS transistor 21.

In the above configuration, the precharge switch 52 is in an ON state in the entire or part of a period during which the output signal VA of the first level-shift circuit 23 is at an "L" level. That is, the precharge switch 5 is in the ON state 2 until the capacitor 51 reaches a predetermined voltage. In parallel with this, the N-channel MOS transistor 28 is in the ON state in a period during which the output signal VA of the first level-shift circuit 23 is at the "L" level, and the output terminal OUTP has the voltage of the low-potential-side power supply VSSC.

The charge switch 53 is in the ON state in the entire or part of a period during which the output signal VA of the first level-shift circuit 23 is at an "H" level. That is, the charge switch 53 is in the ON state until the potential of the gate terminal of the P-channel MOS transistor 21 reaches a predetermined voltage (ideally, the threshold voltage of the P-channel MOS transistor 21). In parallel with this, the N-channel MOS transistor 28 is in an OFF state in a period during which the output signal VA of the first level-shift circuit 23 is at the "H" level, and the output terminal OUTP has the voltage of the high potential-side power supply VDDC.

Next, an operation of the first basic configuration illustrated in FIG. 2A will be described. In a case of causing the P-channel MOS transistor 21 to transition from the OFF state (open state) to the ON state (closed state), the transistor driver circuit 10 first sets the output signal VA of the first level-shift circuit 23 to the "H" level.

As a result, the P-channel MOS transistor 41 starts to transition to the OFF state (open state), and the N-channel MOS transistor 42 starts to transition to the ON state (closed state). In this case, the driving force of the N-channel MOS transistor 42 is limited, so that the potential of the gate of the P-channel MOS transistor 21 gradually transitions to the "L" level.

Therefore, the P-channel MOS transistor 21 does not suddenly transition to the ON state (closed state). In addition, the power transistor at the subsequent stage does not suddenly transition to the ON state (closed state).

In parallel with the above-described operation, the charge switch 53 enters the ON state, and thereby the charge charged in the capacitor 51 is supplied to the gate terminal of the P-channel MOS transistor 21. Then, the potential of the gate terminal of the P-channel MOS transistor 21 sharply drops and naturally becomes a potential near the threshold voltage Vth of the P-channel MOS transistor 21 due to the ratio between the capacitance of the capacitor 51 and the capacitance (gate capacitance) of the gate terminal.

Subsequently, when the output signal VA of the first level-shift circuit 23 becomes the "L" level, the P-channel MOS transistor 41 starts to transition to the ON state (closed state), and the N-channel MOS transistor 42 starts to transition to the OFF state (open state).

In parallel with this, the precharge switch 52 enters the ON state, and the capacitor 51 is discharged until reaching the potential of the low potential side VSSD by the high-potential-side power supply VDDC. When the time for completing the discharge of the capacitor 51 has elapsed, the precharge switch 52 enters the OFF state.

Therefore, a high-speed driving is performed in the period until the gate potential VG of the P-channel MOS transistor 21 reaches the potential near the threshold voltage Vth from 0 volt. The driving force can be controlled with the current source without performing feedback control in the driving force limitation period during which the driving force is desired to be limited (period during which the driving force of the P-channel MOS transistor 21 is desired to be limited).

Next, an operation of a modification of the first basic configuration illustrated in FIG. 2B will be described. In a case of causing the P-channel MOS transistor 21 to transition from the OFF state (open state) to the ON state (closed state), the output signal VA of the first level-shift circuit 23 is set to the "H" level.

As a result, the P-channel MOS transistor 41 starts to transition to the OFF state (open state), and the N-channel MOS transistor 42 starts to transition to the ON state (closed state). In this case, the driving force of the N-channel MOS transistor 42 is limited, so that the potential of the gate of the P-channel MOS transistor 21 gradually transitions to the "L"

level. In parallel with this, the gate potential of the P-channel MOS transistor gradually transitions to the "L" level.

Therefore, the P-channel MOS transistor 21 does not suddenly transition to the ON state (closed state), and the N-channel MOS transistor 28 does not suddenly transition to the OFF state. As a result, the power transistor at the subsequent stage does not suddenly transition to the ON state (closed state).

In parallel with the above operation, the charge switch 53 enters the ON state, and the charge charged in the capacitor 51 is supplied to the gate terminal of the P-channel MOS transistor 21 and the gate terminal of the N-channel MOS transistor 28.

Then, the potential of the gate terminal of the P-channel MOS transistor 21 sharply drops and naturally becomes a potential near the threshold voltage Vth of the P-channel MOS transistor 21 due to the ratio between the capacitance of the capacitor 51 and the capacitance (gate capacitance) of the gate terminal. In the same manner, the potential of the gate terminal of the N-channel MOS transistor sharply drops and naturally becomes a potential near the threshold voltage Vth of the N-channel MOS transistor 28 due to the ratio between the capacitance of the capacitor 51 and the capacitance (gate capacitance) of the gate terminal.

Subsequently, when the output signal VA of the first level-shift circuit 23 becomes the "L" level, the P-channel MOS transistor 41 starts to transition to the ON state (closed state), and the N-channel MOS transistor 42 starts to transition to the OFF state (open state).

In parallel with this, the precharge switch 52 enters the ON state, and the capacitor 51 is discharged to the potential of the low potential side VSSC by the high-potential-side power supply VDDC. When the time for completing the discharge of the capacitor 51 has elapsed, the precharge switch 52 enters the OFF state. The P-channel MOS transistor 41 has no limitation on the driving force. Therefore, the gate potential of the N-channel MOS transistor 28 immediately exceeds the threshold voltage Vth, and the level of the output terminal OUTP becomes the potential level of the low-potential-side power supply VSSC.

According to the modification of the first basic configuration illustrated in FIG. 2B, a high-speed driving is performed in the period until the gate potential VG of the P-channel MOS transistor 21 becomes the potential in the vicinity of the threshold voltage Vth from 0 volt. Therefore, the driving force can be controlled with the current source without performing feedback control in the driving force limitation period during which the driving force is desired to be limited (period during which the driving force of the P-channel MOS transistor 21 is desired to be limited).

Figure 3:
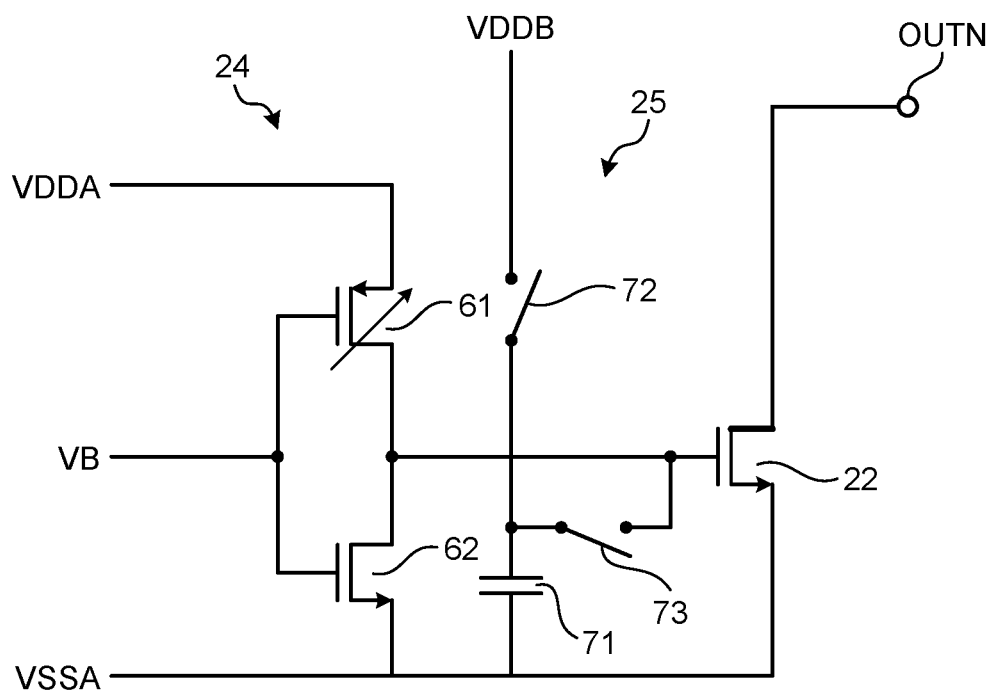
FIG. 3 is a second basic configuration explanatory diagram of the embodiment.

FIG. 3 is a second basic configuration explanatory diagram of the embodiment. In FIG. 3, the first variable amplifier 24 includes a driving force variable P-channel MOS transistor 61 and an N-channel MOS transistor 62. The driving force variable P-channel MOS transistor 61 includes a source terminal connected to a high-potential-side power supply VDDA, a drain terminal connected to the gate terminal of the N-channel MOS transistor 22, and a gate terminal to which the output signal VB of the first PWM power supply VPWMH is input. The N-channel MOS transistor 62 includes a drain terminal connected to the gate terminal of the N-channel MOS transistor 22, a source terminal connected to the low-potential-side power supply VSSA, and a gate terminal to which the output signal VB of the first PWM power supply VPWMH is input.

The first delay-time adjustment circuit 25 includes a capacitor 71, a precharge switch 72, and a charge switch 73.

In the capacitor 71, one end is connected to the low-potential-side power supply VSSA. In the precharge switch 72, one end is connected to the other end of the capacitor 71 and the other end is connected to the high-potential-side power supply VDDB. In the charge switch 73, one end connected to the other end of the capacitor 71 and the other end is connected to the gate terminal of the N-channel MOS transistor 22.

In the above-described configuration, the precharge switch 72 is in the ON state in the entire or part of a period during which the output signal VB of the first PWM power supply VPWMH is at the "H" level. That is, the precharge switch 72 is in the ON state until the capacitor 51 reaches a predetermined voltage.

The charge switch 73 is in the ON state in the entire or part of a period during which the output signal VB of the first PWM power supply VPWMH is at the "L" level. That is, the charge switch 73 is in the ON state until the potential of the gate terminal of the N-channel MOS transistor 22 reaches a predetermined voltage (ideally, the threshold voltage of the N-channel MOS transistor 22).

Next, an operation of the second basic configuration will be described. In a case of causing the N-channel MOS transistor 22 to transition from the OFF state (open state) to the ON state (closed state), the output signal VB of the first PWM power supply VPWMH is set to the "L" level.

As a result, the N-channel MOS transistor 62 starts to transition to the OFF state (open state), and the P-channel MOS transistor 61 starts to transition to the ON state (closed state). In this case, since the driving force of the P-channel MOS transistor 61 is limited, the potential of the gate of the N-channel MOS transistor 22 gradually transitions to the "H" level.

Therefore, the N-channel MOS transistor 22 does not suddenly transition to the ON state (closed state). As a result, the power transistor at the subsequent stage does not suddenly transition to the ON state (closed state).

In parallel with the above operation, the charge switch 73 enters the ON state, and the charge charged in the capacitor 71 is supplied to the gate terminal of the N-channel MOS transistor 22. Then, the potential of the gate terminal of the N-channel MOS transistor 22 sharply rises and naturally becomes a potential near the threshold voltage Vth of the N-channel MOS transistor 22 due to the ratio between the capacitance of the capacitor 71 and the capacitance (gate capacitance) of the gate terminal.

Subsequently, when the output signal VB of the first PWM power supply VPWMH becomes the "H" level, the P-channel MOS transistor 61 starts to transition to the OFF state (open state), and the N-channel MOS transistor 62 starts to transition to the ON state (closed state).

In parallel with this, since the output signal VB="H" level, the precharge switch 72 enters the ON state, and the capacitor 71 is charged to the potential of the high-potential-side power supply VDDB by the high-potential-side power supply VDDC. When the time for completing the charge of the capacitor 71 has elapsed, the precharge switch 72 enters the OFF state.

Therefore, a high-speed driving is performed in the period until the gate potential VG of the N-channel MOS transistor 22 reaches the potential near the threshold voltage Vth from 0 volt. The driving force can be controlled with the current source without performing feedback control in the driving force limitation period during which the driving force is desired to be limited (period during which the driving force of the N-channel MOS transistor 22 is desired to be limited).

Next, a more specific embodiment will be described. In the following description, for helping understanding, an embodiment corresponding to the above-described second basic configuration will be described. However, in an actual circuit, the first basic configuration that a target to be driven in which the carrier involved in the charge transfer is a hole is a P-channel MOS transistor is technically more effective.

(1) First Embodiment

Figure 4:
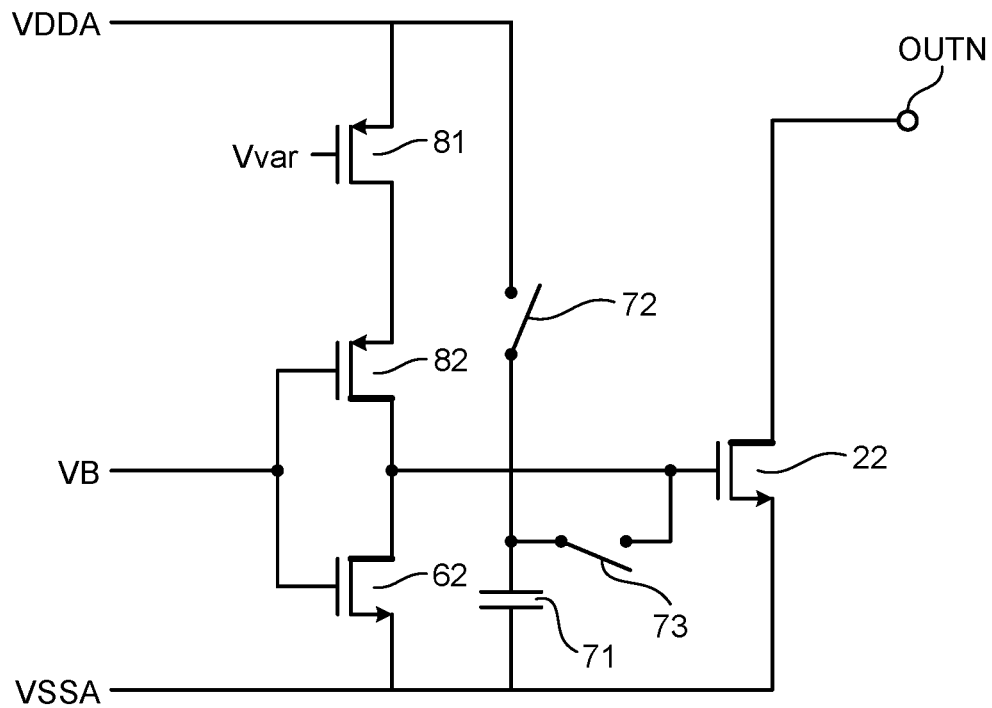
FIG. 4 is a circuit configuration diagram of a main part of a first embodiment.

FIG. 4 is a circuit configuration diagram of a main part of a first embodiment. In FIG. 4, the same portions as those in the explanatory diagram of the second basic configuration of FIG. 3 are denoted by the same reference numerals, and the detailed description thereof is incorporated. The configuration of the first embodiment is different from the second basic configuration in that, a first P-channel MOS transistor 81 and a second P-channel MOS transistor 82 are provided in place of the driving force variable P-channel MOS transistor 61. The first P-channel MOS transistor 81 serves as a variable current source that a control signal Vvar is input to a gate terminal and a current corresponding to the control signal Vvar can flow. The second P-channel MOS transistor 82 is connected in series to the first P-channel MOS transistor 81.

Prior to the description of the first embodiment, specific configurations of the precharge switch 72 and the charge switch 73 will be described. The configuration of the precharge switch 72 differs depending on connection to a high-potential-side power supply or a low-potential-side power supply.

Figure 5:
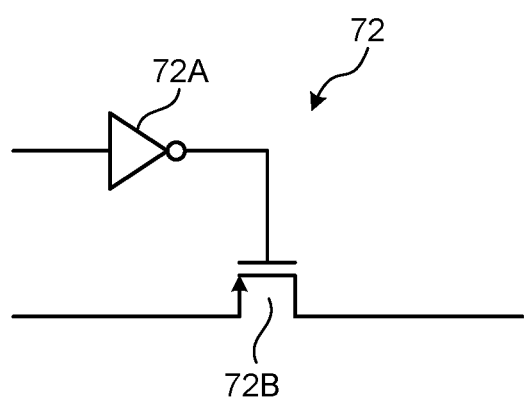
FIG. 5 is an explanatory diagram of a configuration example in a case where a precharge switch is connected to a high-potential-side power supply.

FIG. 5 is an explanatory diagram of a configuration example in a case where a precharge switch is connected to a high-potential-side power supply. In a case where the precharge switch 72 is connected to a high-potential-side power supply as illustrated in FIG. 5, the precharge switch 72 includes an inverter 72A whose drive control signal (in this example, the output signal VB of the first PWM power supply VPWMH) is connected to an input terminal, and a P-channel MOS transistor 72B whose gate terminal is connected to an output terminal of the inverter.

Figure 6:
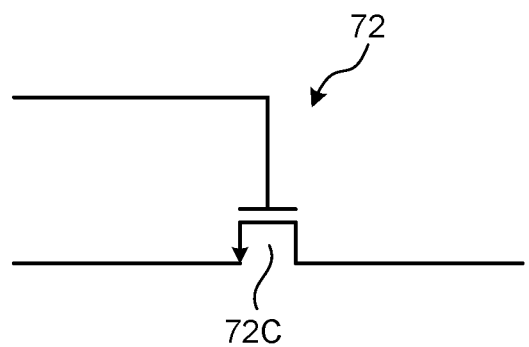
FIG. 6 is an explanatory diagram of a configuration example in a case where a precharge switch is connected to a low-potential-side power supply.

FIG. 6 is an explanatory diagram of a configuration example in a case where a precharge switch is connected to a low-potential-side power supply.

In a case where the precharge switch 72 is connected to the low-potential-side power supply, as illustrated in FIG. 6, for example, the precharge switch includes an N-channel MOS transistor 72C having a gate terminal to which a drive control signal is input.

In the above configuration, the precharge switch 72 enters the ON state when the drive control signal is at the "H" level, and the precharge switch 72 enters the OFF state when the drive control signal is at the "L" level.

The charge switch 73 operates in a floating state, so that it is generally configured as a complementary switch.

Figure 7:
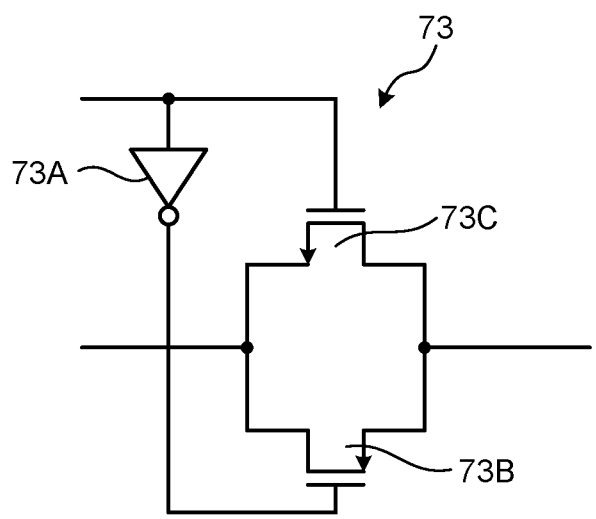
FIG. 7 is an explanatory diagram of a configuration example of a charge switch.

FIG. 7 is an explanatory diagram of a configuration example of a charge switch. As illustrated in FIG. 7, the charge switch 73 includes, for example, an inverter 73A, a P-channel MOS transistor 73B, and an N-channel MOS transistor 73C. The inverter 73A includes an input terminal connected to a drive control signal (in this example, the logic inversion signal of the output signal VB of the first PWM power supply VPWMH). The P-channel MOS transistor 73B includes a gate terminal connected to an output terminal of the inverter 73A. The N-channel MOS transistor 73C includes a gate terminal to which a drive control signal is input, a source terminal connected to a drain terminal of the P-channel MOS transistor 73B, and a drain terminal connected to a source terminal of the P-channel MOS transistor 73B.

In the above configuration, the charge switch 73 enters the ON state when the drive control signal is at the "H" level. The charge switch 73 enters the OFF state when the drive control signal is at the "L" level.

Control of the precharge switch 72 and the charge switch 73 will be described. In the present embodiment, the precharge switch 72 and the charge switch 73 are ideally exclusively turned on/off so as not to simultaneously enter the ON state.

As a first method, there is a method of controlling the precharge switch 72 and the charge switch 73 by simply inverting a drive control signal (in this example, the output signal VB of the first PWM power supply VPWMH) with an inverter.

Figure 8:
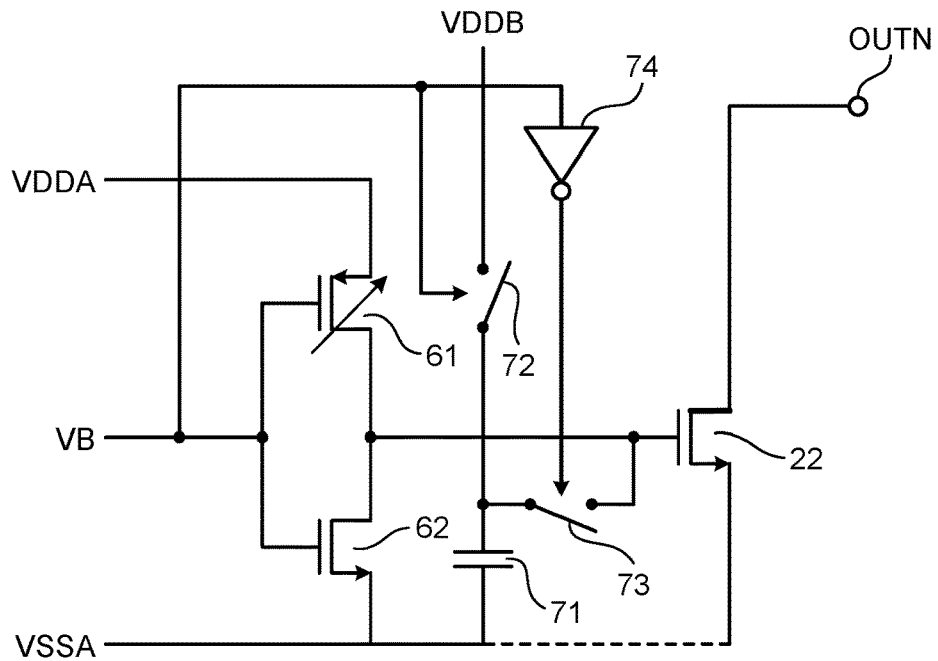
FIG. 8 is an explanatory diagram of a circuit configuration example in a case where a precharge switch and a charge switch are controlled by inverting a logic with an inverter.

FIG. 8 is an explanatory diagram of a circuit configuration example in a case where a precharge switch and a charge switch are controlled by inverting a logic with an inverter. In FIG. 8, the same portions as those of the first embodiment in FIG. 4 are denoted by the same reference numerals, and the detailed description thereof is incorporated.

In the example of FIG. 8, the output signal VB of the first PWM power supply VPWMH is input as a drive control signal of the precharge switch 72. As a drive control signal for the charge switch 73, the output signal VB of the first PWM power supply VPWMH is inverted and input via an inverter 74.

This configuration can simplify the circuit configuration. However, depending on the configurations of the precharge switch 72 and the charge switch 73, there is a possibility of causing malfunction due to occurrence of an overlap that the precharge switch 72 and the charge switch 73 simultaneously enter the ON state (closed state). Therefore, this configuration is not suitable for applications where high reliability is required.

As a second method, there is a method of generating a positive logic drive control signal and a negative logic drive control signal on the basis of a drive control signal (in this example, the output signal VB of the first PWM power supply VPWMH) in a so-called non-overlapping clock generation circuit and controlling the precharge switch 72 and the charge switch 73.

Figure 9:
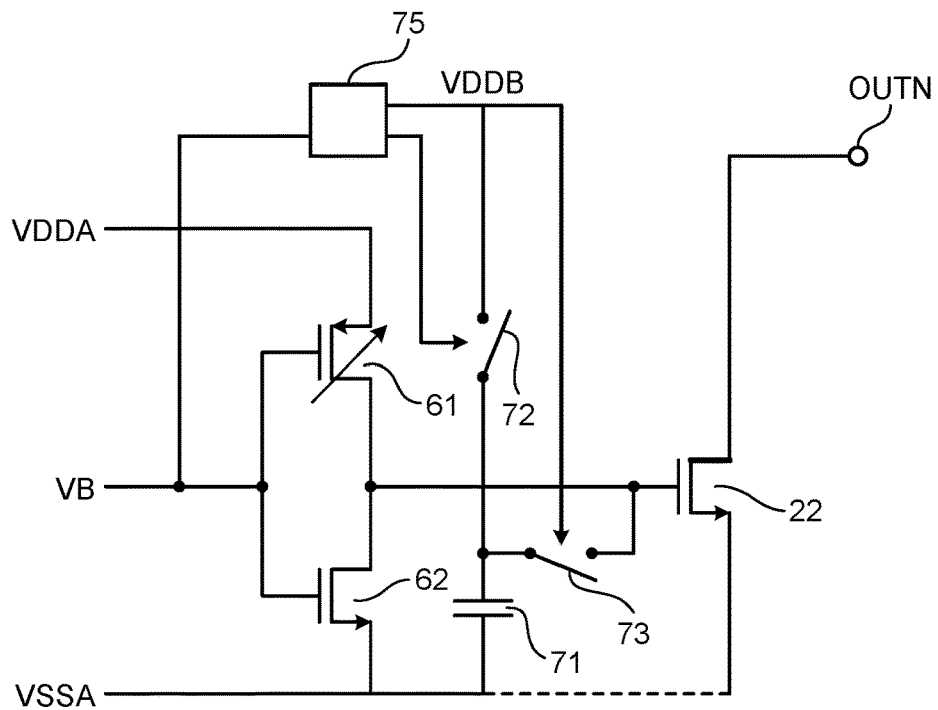
FIG. 9 is an explanatory diagram of a circuit configuration example in a case where a precharge switch and a charge switch are controlled by generating a drive control signal of positive logic and a drive control signal of negative logic with a non-overlapping clock generation circuit.

FIG. 9 is an explanatory diagram of a circuit configuration example in a case where a precharge switch and a charge switch are controlled by generating a drive control signal of positive logic and a drive control signal of negative logic with a non-overlapping clock generation circuit. In FIG. 9, the same portions as those of the first embodiment in FIG. 4 are denoted by the same reference numerals, and the detailed description thereof is incorporated.

In the example of FIG. 9, the output signal VB of the first PWM power supply VPWMH is input as an input of the non-overlapping clock generation circuit.

Figure 10:
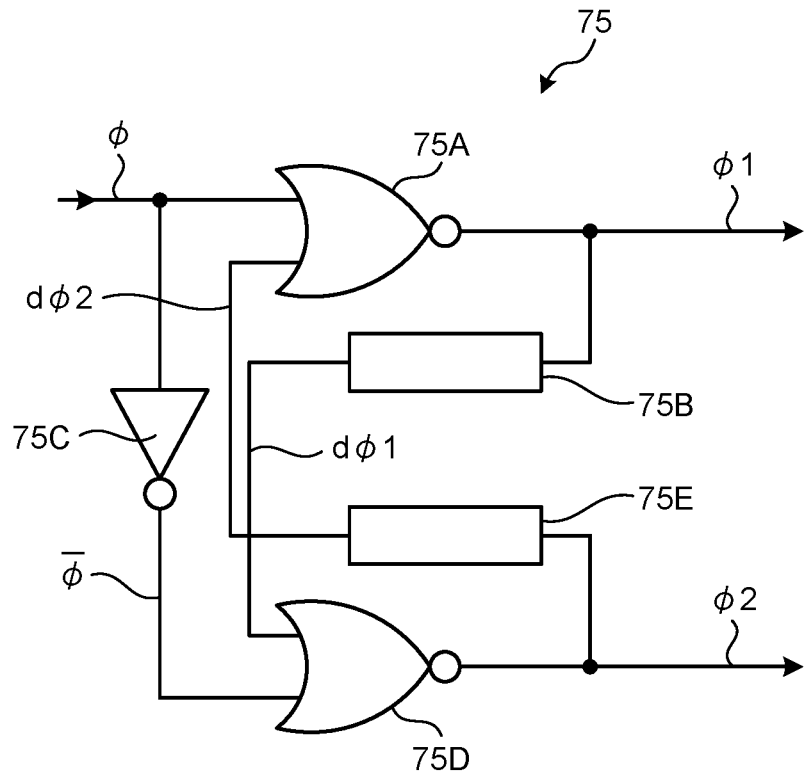
FIG. 10 is a schematic configuration block diagram of a configuration example of a non-overlapping clock generation circuit.

FIG. 10 is a schematic configuration block diagram of a configuration example of a non-overlapping clock generation circuit. The non-overlapping clock generation circuit 75 includes a first NOR circuit 75A, a first delay circuit 75B, an inverter 75C, a second NOR circuit 75D, and a second delay circuit 75E. The first NOR circuit 75A receives an input clock signal ϕ. (rectangular pulse signal) at one input terminal, and receives the second delay clock signal dϕ2 at the other input terminal. The first NOR circuit 75A negates the logical sum of the input clock signal ϕ and the second delay clock signal dϕ2, and outputs the first clock signal ϕ1 from the output terminal. The first delay circuit 75B includes an input terminal to which the first clock signal ϕ1 is input. The first delay circuit 75B delays the first clock signal ϕ1 by a predetermined time, and outputs the first delay clock signal dϕ1 from an output terminal. The inverter 75C includes an input terminal to which the input clock signal ϕ is input. The inverter 75C inverts the input clock signal ϕ and outputs the inverted input clock signal/ϕ. The second NOR circuit 75D includes one input terminal to which the first delayed clock signal dϕ1 is input, and another input terminal to which the inverted input clock signal/ϕ is input. The second NOR circuit 75D negates the logical sum of the first delayed clock signal dϕ1 and the inverted input clock signal/ϕ, and outputs the second clock signal ϕ2 from the output terminal. The second delay circuit 75E delays the second clock signal ϕ2 by a predetermined time and outputs the second delay clock signal dϕ2 from the output terminal.

In the above configuration, the phase of the input clock signal ϕ, the phase of the second clock signal ϕ2, the phase of the inverted input clock signal/ϕ, and the phase of the first clock signal ϕ1 are the same phase.

Figure 11:
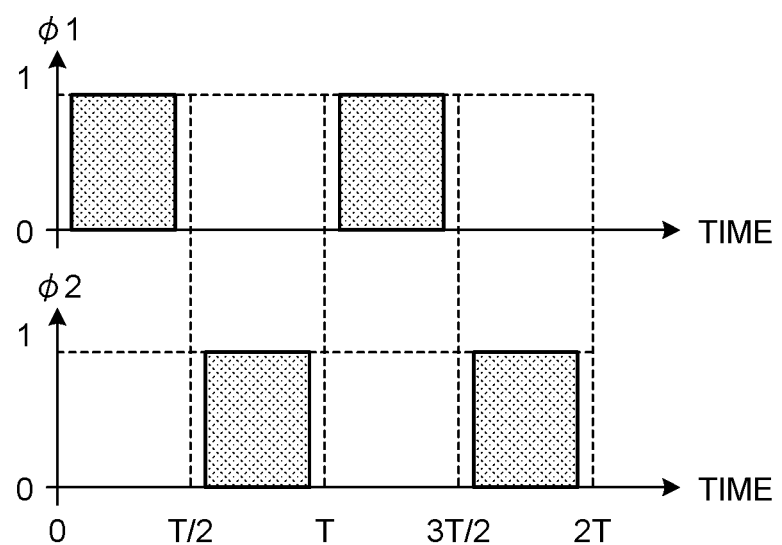
FIG. 11 is an explanatory diagram of an example of an output signal of the non-overlapping clock generation circuit.

FIG. 11 is an explanatory diagram of an example of an output signal of the non-overlapping clock generation circuit. As illustrated in FIG. 11, the first clock signal ϕ1 and the second clock signal ϕ2 are set to the "H" level every ½ cycle (=T/2) without overlap.

This configuration may complicate the circuit configuration. However, regardless of the configurations of the precharge switch 72 and the charge switch 73, it is possible to prevent occurrence of overlap that the precharge switch 72 and the charge switch 73 simultaneously enter the ON state (closed state). Therefore, highly reliable operation can be performed.

Next, an operation of the first embodiment will be described. When the output signal VB of the first PWM power supply VPWMH becomes the "H" level, the precharge switch 72 enters the ON state, and the capacitor 71 is charged to the potential of the high-potential-side power supply VDDA (or a desired potential) by the high potential side power supply VDDA.

When the time for completing the charge of the capacitor 71 has elapsed, the precharge switch 72 enters the OFF state. At this time, the "H" level is applied to the gate terminal of the N-channel MOS transistor 62, so that the N-channel MOS transistor 62 is in the ON state (closed state). Additionally, the gate terminal of the N-channel MOS transistor 22 is in the "L" level, and the N-channel MOS transistor 22 is in the OFF state (open state).

Subsequently, in order to cause the N-channel MOS transistor 22 to transition from the OFF state (open state) to the ON state (closed state), the transistor driver circuit 10 sets the output signal VB of the first PWM power supply VPWMH to the "L" level.

As a result, the second P-channel MOS transistor 82 starts to shift to the ON state (close state), and the N-channel MOS transistor 62 starts to transition to the OFF state (open state). In this case, a first P-channel MOS transistor 81 serving as a variable current source is provided between the P-channel MOS transistor 82 and the high-potential-side power supply VDDA, and movement of charges is limited. That is, the first P-channel MOS transistor 81 and the second P-channel MOS transistor 83 operate similarly to the driving force variable P-channel MOS transistor 61, and the driving force is limited. Then, the potential of the gate of the N-channel MOS transistor 22 gradually transitions to the "H" level.

Therefore, the N-channel MOS transistor 22 does not suddenly transition to the ON state (closed state). Additionally, the power transistor at the subsequent stage does not rapidly transition to the ON state (closed state), and the through current does not flow, and therefore, the power consumption does not wastefully increase.

When the output signal VB of the first PWM power supply VPWMH becomes the "L" level, the N-channel MOS transistor 62 thereby starts to transition to the OFF state (open state) in parallel with the above-described operation.

Moreover, the charge switch 73 enters the ON state, and the charge charged in the capacitor 71 moves to the gate terminal of the N-channel MOS transistor 22. The potential of the gate terminal of the N-channel MOS transistor 22 sharply rises and naturally becomes a potential near the threshold voltage Vth of the N-channel MOS transistor 22 due to the ratio between the capacitance of the capacitor 71 and the capacitance (gate capacitance) of the gate terminal.

Therefore, the driving force can be controlled by the variable current source without performing feedback control in the driving force limitation period during which the driving force is desired to be limited (the period during which the driving force of the N-channel MOS transistor 22 is desired to be limited) while shortening the period until the gate potential VG of the N-channel MOS transistor 22 becomes the potential near the threshold voltage Vth from 0 volt.

As a result, according to the first embodiment, in the N-channel MOS transistor 22 to be driven, it is possible to limit the driving force of the subsequent N-channel MOS transistor while shortening the period until the gate potential VG reaches the voltage near the threshold voltage Vth from 0 volt.

(1.1) Another Aspect of First Embodiment

Figure 12:
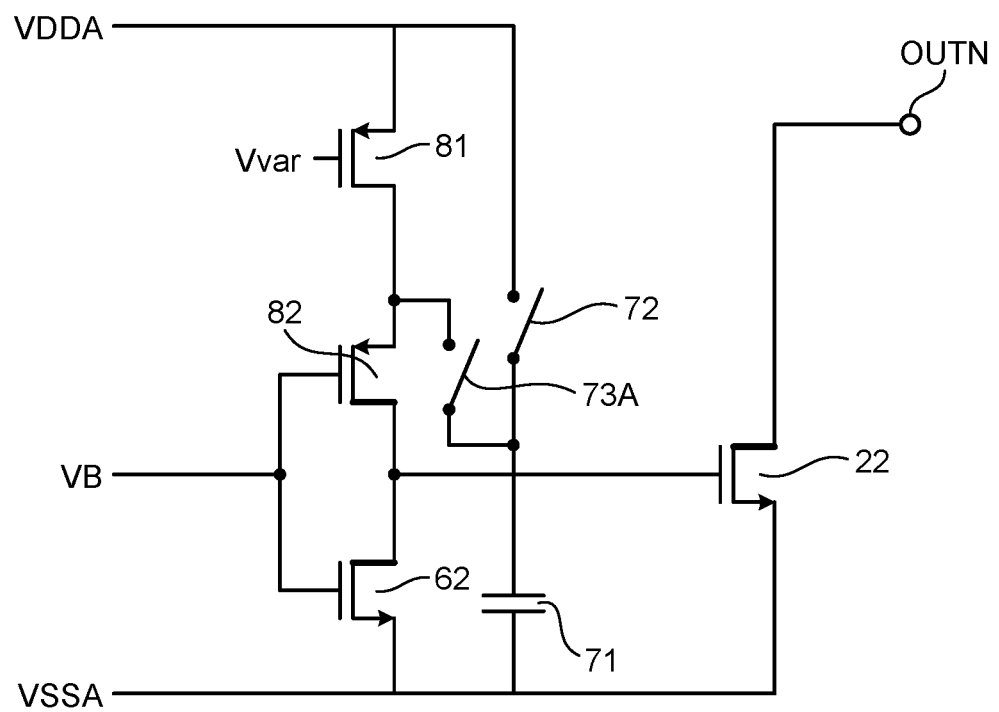
FIG. 12 is a circuit configuration diagram of a main part of another aspect of the first embodiment.

FIG. 12 is a circuit configuration diagram of a main part of another aspect of the first embodiment. In FIG. 12, the same portions as those of the first embodiment in FIG. 4 are denoted by the same reference numerals, and the detailed description thereof is incorporated. Another aspect of the first embodiment in FIG. 12 is different from the first embodiment in FIG. 4 in that, a charge switch 73A is provided in place of the charge switch 73. The charge switch 73A includes one end connected to the other end (high potential side) of the capacitor 71, and the other end connected to a connection point between the drain terminal of the first P-channel MOS transistor 81 and the source terminal of the second P-channel MOS transistor 82.

Next, an operation of another aspect of the first embodiment will be described. In this aspect, the operation and effect until the output signal VA of the first level-shift circuit 23 becomes the "L" level are the same as those of the first embodiment. Therefore, the operation after the output signal VA of the first level-shift circuit 23 becomes the "L" level will be described.

With the output signal VA of the first level-shift circuit 23 being at the "L" level, the N-channel MOS transistor 62 starts to transition to the OFF state (open state) in parallel with the above operation.

The charge switch 73A enters the ON state, and the charge charged in the capacitor 71 moves to the gate terminal of the N-channel MOS transistor 22 via the source terminal and the drain terminal of the second P-channel MOS transistor 82. As a result, the potential of the gate terminal of the N-channel MOS transistor 22 sharply rises and naturally becomes a potential near the threshold voltage Vth of the N-channel MOS transistor 22 due to the ratio between the capacitance of the capacitor 71 and the capacitance (gate capacitance) of the gate terminal.

Therefore, the driving force can be controlled by the variable current source without performing the feedback control in the driving force limitation period during which the driving force is desired to be limited (the period during which the driving force of the N-channel MOS transistor 22 is desired to be limited) while shortening the period until the gate potential VG of the N-channel MOS transistor 22 becomes the potential near the threshold voltage Vth from 0 volt.

As described above, according to the other aspect of the first embodiment, effects similar to the effects of the first embodiment can be obtained.

(2) Second Embodiment

Figure 13A:
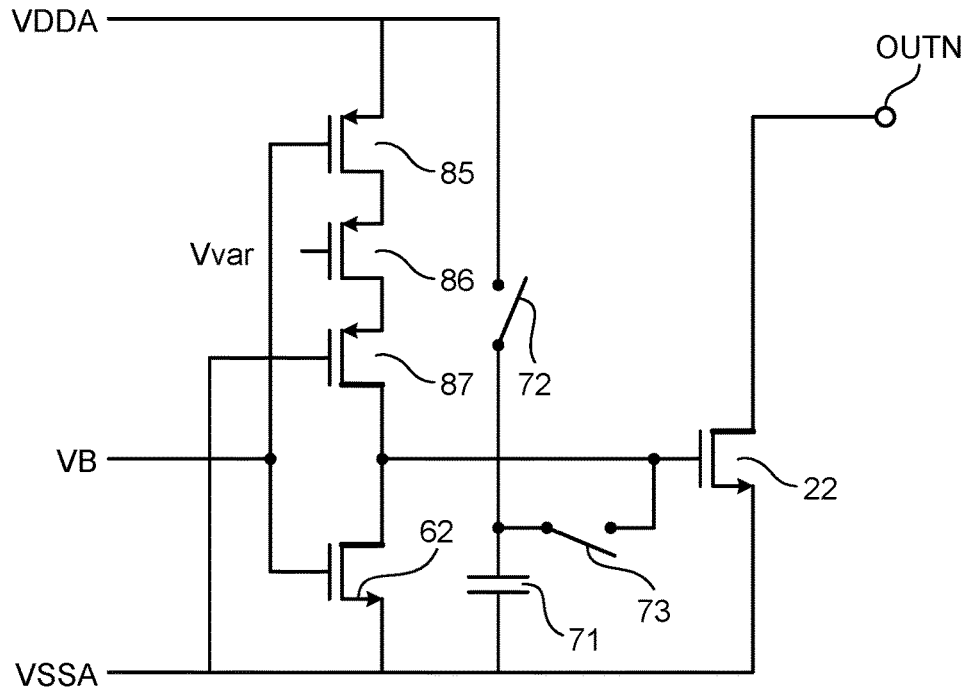
FIG. 13A is a circuit configuration diagram of a main part of a second embodiment.

FIG. 13A is a circuit configuration diagram of a main part of a second embodiment. In FIG. 13A, the same portions as those in the second basic configuration explanatory diagram of FIG. 3 are denoted by the same reference numerals, and the detailed description thereof is incorporated.

The configuration of the second embodiment is different from the second basic configuration in that, in place of the driving force variable P-channel MOS transistor 61, a driving force constant first P-channel MOS transistor 85, a second P-channel MOS transistor 86, and a third P-channel MOS transistor 87 are provided. The second P-channel MOS transistor 86 includes a source terminal connected to a drain terminal of the first P-channel MOS transistor 85. The second P-channel MOS transistor 86 serves as a variable current source. The third P-channel MOS transistor 87 includes a source terminal connected to a drain terminal of the second P-channel MOS transistor 86, a drain terminal connected to a drain terminal of the N-channel MOS transistor 62, and a gate terminal connected to a low-potential-side power supply VSSA.

In the configuration above, the third P-channel MOS transistor 87 is provided for improving the drain breakdown voltage and enhancing the reliability, and is not necessarily provided.

Next, an operation of the second embodiment will be described. When the output signal VB of the first PWM power supply VPWMH becomes the "H" level, the precharge switch 72 enters the ON state, and the capacitor 71 is charged to the potential of the high-potential-side power supply VDDA (or a desired potential) by the high potential side power supply VDDA.

When the time for completing the charge of the capacitor 71 has elapsed, the precharge switch 72 enters the OFF state. At this time, the "H" level is applied to the gate terminal of the N-channel MOS transistor 62, so that the N-channel MOS transistor 62 is in the ON state (closed state). Additionally, the gate terminal of the N-channel MOS transistor 22 is in the "L" level, and the N-channel MOS transistor 22 is in the OFF state (open state).

Subsequently, in order to cause the N-channel MOS transistor 22 to transition from the OFF state (open state) to the ON state (closed state), the output signal VB of the first PWM power supply VPWMH is set to the "L" level. As a result, the first P-channel MOS transistor 85 starts to transition to the ON state (closed state), and the N-channel MOS transistor 62 starts to transition to the OFF state (open state).

In this configuration, the second P-channel MOS transistor 86 serving as a variable current source is provided between the first P-channel MOS transistor 85 and the third P-channel MOS transistor 87, and movement of charges is limited. That is, the first P-channel MOS transistor 85 and the second P-channel MOS transistor 86 operate similarly to the driving force variable P-channel MOS transistor 61, and the driving force is limited. Then, the potential of the gate of the N-channel MOS transistor 22 gradually transitions to the "H" level.

Therefore, the N-channel MOS transistor 22 does not suddenly transition to the ON state (closed state). As a result, the power transistor at the subsequent stage does not rapidly transition. The through current does not flow, and therefore, the power consumption does not wastefully increase.

When the output signal VB of the first PWM power supply VPWMH becomes the "L" level, the N-channel MOS transistor 62 starts to transition to the OFF state (open state) in parallel with the above operation.

Moreover, the charge switch 73 enters the ON state, and the charge charged in the capacitor 71 moves to the gate terminal of the N-channel MOS transistor 22. The potential of the gate terminal of the N-channel MOS transistor 22 sharply rises and naturally becomes a potential near the threshold voltage Vth of the N-channel MOS transistor 22 due to the ratio between the capacitance of the capacitor 71 and the capacitance (gate capacitance) of the gate terminal.

Therefore, the driving force can be controlled by the variable current source without performing feedback control in the driving force limitation period during which the driving force is desired to be limited (the period during which the driving force of the N-channel MOS transistor 22 is desired to be limited) while shortening the period until the gate potential VG of the N-channel MOS transistor 22 becomes the potential near the threshold voltage Vth from 0 volt. As a result, according to the second embodiment, in addition to the effects of the first embodiment, the drain breakdown voltage can be improved and thereby the reliability can be enhanced.

(2.1) Another Aspect of Second Embodiment

Figure 13B:
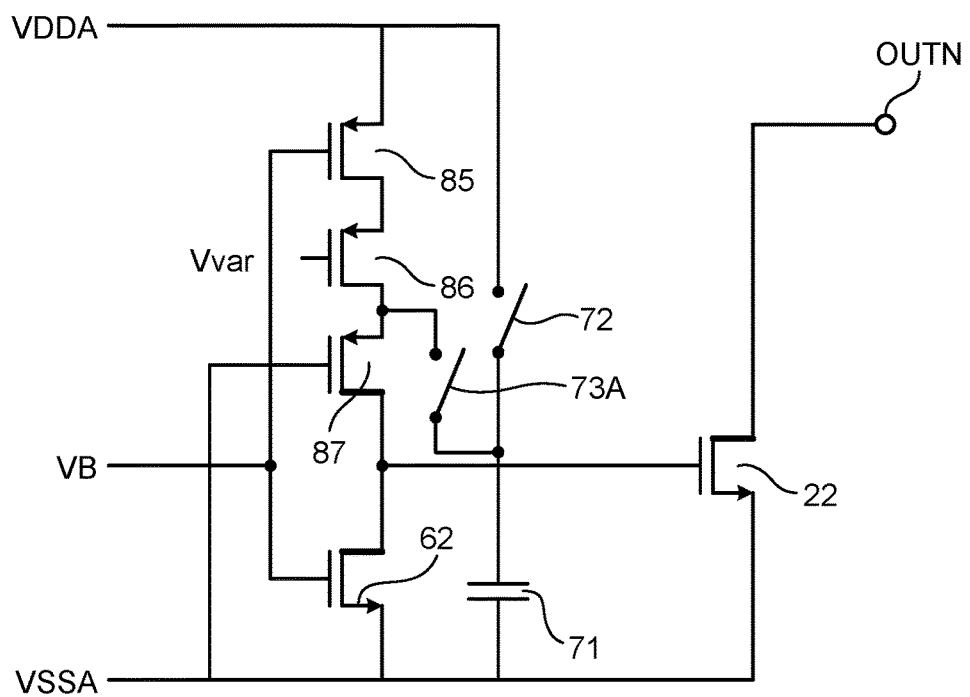
FIG. 13B is a circuit configuration diagram of a main part of another aspect of the second embodiment.

FIG. 13B is a circuit configuration diagram of a main part of another aspect of the second embodiment. In FIG. 13B, the same portions as those of the second embodiment in FIG. 13A are denoted by the same reference numerals, and the detailed description thereof is incorporated. Another aspect of the second embodiment in FIG. 13B is different from the second embodiment in FIG. 13A in that, a charge switch 73A is provided in place of the charge switch 73. The charge switch 73A includes one end connected to the other end (high potential side) of the capacitor 71, and the other end connected to a connection point between the drain terminal of the second P-channel MOS transistor 86 and the source terminal of the third P-channel MOS transistor 87.

Next, an operation of another aspect of the second embodiment will be described. In the configuration above, the operation and effect until the output signal VB of the first PWM power supply VPWMH becomes the "L" level are the same as those of the second embodiment. Therefore, the operation after the output signal VA of the first PWM power supply VPWMH becomes the "L" level will be described.

When the output signal VB of the first PWM power supply VPWMH becomes the "L" level, the N-channel MOS transistor 62 starts to transition to the OFF state (open state) in parallel with the above operation.

Moreover, the charge switch 73A enters the ON state. The charge charged in the capacitor 71 moves to the gate terminal of the N-channel MOS transistor 22 via the source terminal and the drain terminal of the third P-channel MOS transistor 87. The potential of the gate terminal of the N-channel MOS transistor 22 sharply rises and naturally becomes a potential near the threshold voltage Vth of the N-channel MOS transistor 22 due to the ratio between the capacitance of the capacitor 71 and the capacitance (gate capacitance) of the gate terminal.

Therefore, the driving force can be controlled by the variable current source without performing the feedback control in the driving force limitation period during which the driving force is desired to be limited (the period during which the driving force of the N-channel MOS transistor 22 is desired to be limited) while shortening the period until the gate potential VG of the N-channel MOS transistor 22 becomes the potential near the threshold voltage Vth from 0 volt.

In this manner, according to another aspect of the second embodiment, in addition to the effects of the first embodiment, the drain breakdown voltage can be improved and the reliability can be enhanced, like the effects of the foregoing second embodiment.

(3) Third Embodiment

Figure 14A:
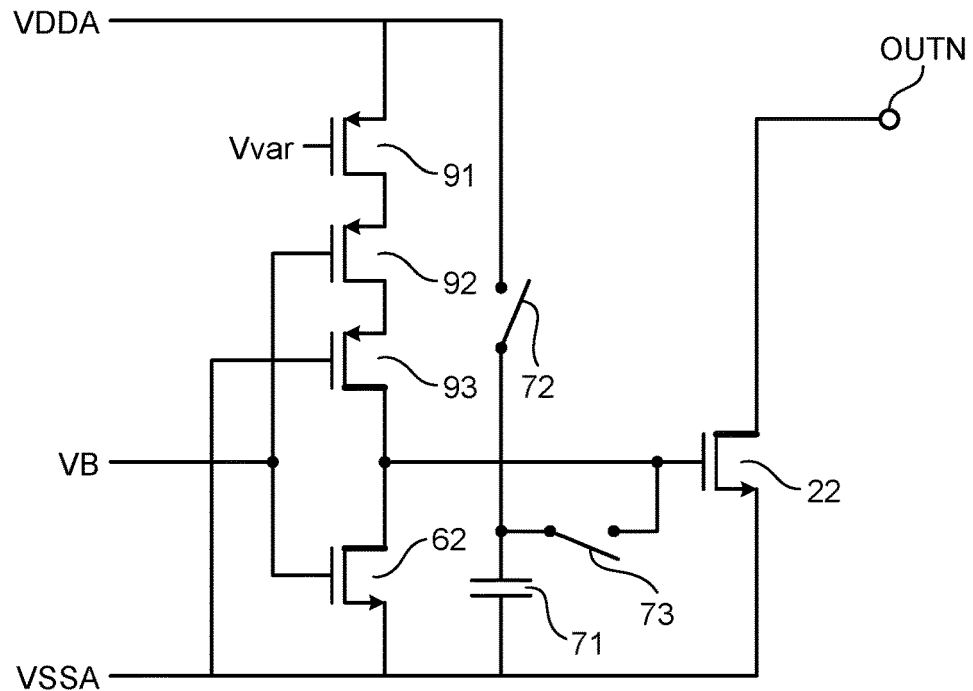
FIG. 14A is a circuit configuration diagram of a main part of a third embodiment.

FIG. 14A is a circuit configuration diagram of a main part of a third embodiment. In FIG. 14A, the same portions as those in the second basic configuration explanatory diagram of FIG. 3 are denoted by the same reference numerals, and the detailed description thereof is incorporated. The configuration of the third embodiment is different from the second basic configuration in that, a first P-channel MOS transistor 91, a second P-channel MOS transistor 92, and a third P-channel MOS transistor 93 are provided in place of the driving force variable P-channel MOS transistor 61. The first P-channel MOS transistor 91 serves as a variable current source. The second P-channel MOS transistor 92 is connected in series to the first P-channel MOS transistor 91. The third P-channel MOS transistor 93 is connected in series to the second P-channel MOS transistor 92. The third P-channel MOS transistor 93 includes a source terminal connected to a drain terminal of the N-channel MOS transistor 62, and a gate terminal connected to a low-potential-side power supply VSSA.

In this configuration, the third P-channel MOS transistor 93 is provided for improving the drain breakdown voltage and thereby enhancing the reliability, and is not necessarily provided.

Next, an operation of the third embodiment will be described. When the output signal VB of the first PWM power supply VPWMH becomes the "H" level, the precharge switch 72 enters the ON state, and the capacitor 71 is charged to the potential of the high-potential-side power supply VDDA (or a desired potential) by the high potential side power supply VDDA.

When the time for completing the charge of the capacitor 71 has elapsed, the precharge switch 72 enters the OFF state.

At this time, the "H" level is applied to the gate terminal of the N-channel MOS transistor 62. The N-channel MOS transistor 62 is in the ON state (closed state). The gate terminal of the N-channel MOS transistor 22 is in the "L" level, and the N-channel MOS transistor 22 is in the OFF state (open state).

Subsequently, in order to cause the N-channel MOS transistor 22 to transition from the OFF state (open state) to the ON state (closed state), the output signal VB of the first PWM power supply VPWMH is set to the "L" level. As a result, the second P-channel MOS transistor 92 starts to transition to the ON state (close state), and the N-channel MOS transistor 62 starts to transition to the OFF state (open state).

In this case, the first P-channel MOS transistor 91 serving as a variable current source is provided between the high-potential side power supply VDDA and the second P-channel MOS transistor 92, and movement of charges is limited.

That is, the first P-channel MOS transistor 91 and the second P-channel MOS transistor 92 operate similarly to the driving force variable P-channel MOS transistor 61, and the driving force is limited. Then, the potential of the gate of the N-channel MOS transistor 22 gradually transitions to the "H" level.

With this configuration, the N-channel MOS transistor 22 does not suddenly transition to the ON state (closed state). As a result, the power transistors at the subsequent stage of the N-channel MOS transistor 22 do not rapidly transition, the two power transistors constituting the upper arm and the lower arm do not simultaneously enter the ON state (closed state), and the through current does not flow, and therefore, power consumption does not wastefully increase.

When the output signal VB of the first PWM power supply VPWMH becomes the "L" level, the N-channel MOS transistor 62 starts to transition to the OFF state (open state) in parallel with the above operation.

Moreover, the charge switch 73 enters the ON state, and the charge charged in the capacitor 71 moves to the gate terminal of the N-channel MOS transistor 22. The potential of the gate terminal of the N-channel MOS transistor 22 sharply rises and naturally becomes a potential near the threshold voltage Vth of the N-channel MOS transistor 22 due to the ratio between the capacitance of the capacitor 71 and the capacitance (gate capacitance) of the gate terminal. Therefore, the driving force can be controlled by the variable current source without performing the feedback control in the driving force limitation period during which the driving force is desired to be limited (the period during which the driving force of the N-channel MOS transistor 22 is desired to be limited) while shortening the period until the gate potential VG of the N-channel MOS transistor 22 becomes the potential near the threshold voltage Vth from 0 volt. As described above, according to the third embodiment, effects similar to the effects of the second embodiment can be obtained.

(3.1) Another Aspect of Third Embodiment

Figure 14B:
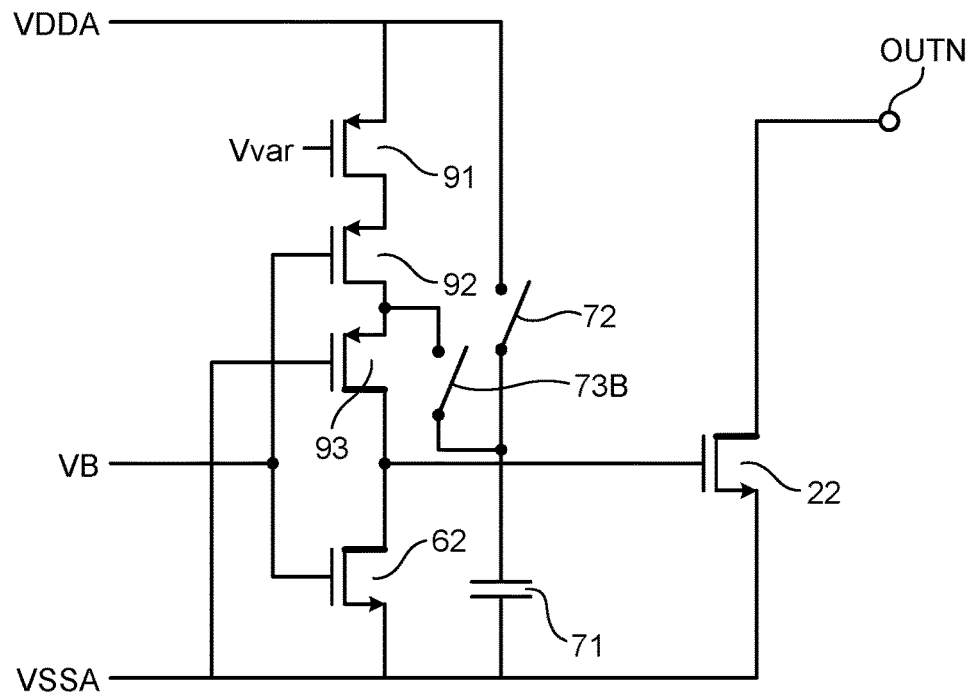
FIG. 14B is a circuit configuration diagram of a main part of another aspect of the third embodiment.

FIG. 14B is a circuit configuration diagram of a main part of another aspect of the third embodiment. In FIG. 14B, the same portions as those of the third embodiment in FIG. 14A are denoted by the same reference numerals, and the detailed description thereof is incorporated. Another aspect of the third embodiment in FIG. 14B is different from the third embodiment in FIG. 14A in that, a charge switch 73B is provided in place of the charge switch 73. The charge switch 73B includes one end connected to the other end (high potential side) of the capacitor 71 and the other end connected to a connection point between the drain terminal of the second P-channel MOS transistor 92 and the source terminal of the third P-channel MOS transistor 93.

Next, an operation of another embodiment of the third embodiment will be described. In this configuration, the operation and effect until the output signal VB of the first PWM power supply VPWMH becomes the "L" level are the same as those of the third embodiment. Therefore, the operation after the output signal VB of the first PWM power supply VPWMH becomes the "L" level will be described.

When the output signal VB of the first PWM power supply VPWMH becomes the "L" level, the N-channel MOS transistor 62 starts to transition to the OFF state (open state) in parallel with the above operation.

Further, the charge switch 73B enters the ON state, and the charge charged in the capacitor 71 moves to the gate terminal of the N-channel MOS transistor 22 via the source terminal and the drain terminal of the third P-channel MOS transistor 93, and the potential of the gate terminal of the N-channel MOS transistor 22 sharply rises and naturally becomes a potential near the threshold voltage Vth of the N-channel MOS transistor 22 due to the ratio between the capacitance of the capacitor 71 and the capacitance (gate capacitance) of the gate terminal.

Therefore, the driving force can be controlled by the variable current source without performing the feedback control in the driving force limitation period during which the driving force is desired to be limited (the period during which the driving force of the N-channel MOS transistor 22 is desired to be limited) while shortening the period until the gate potential VG of the N-channel MOS transistor 22 becomes the potential near the threshold voltage Vth from 0 volt. In this manner, according to the other aspect of the third embodiment, the same effects as those of the second embodiment can be obtained like the third embodiment.

(3.2) Still Another Aspect of Third Embodiment

Figure 14C:
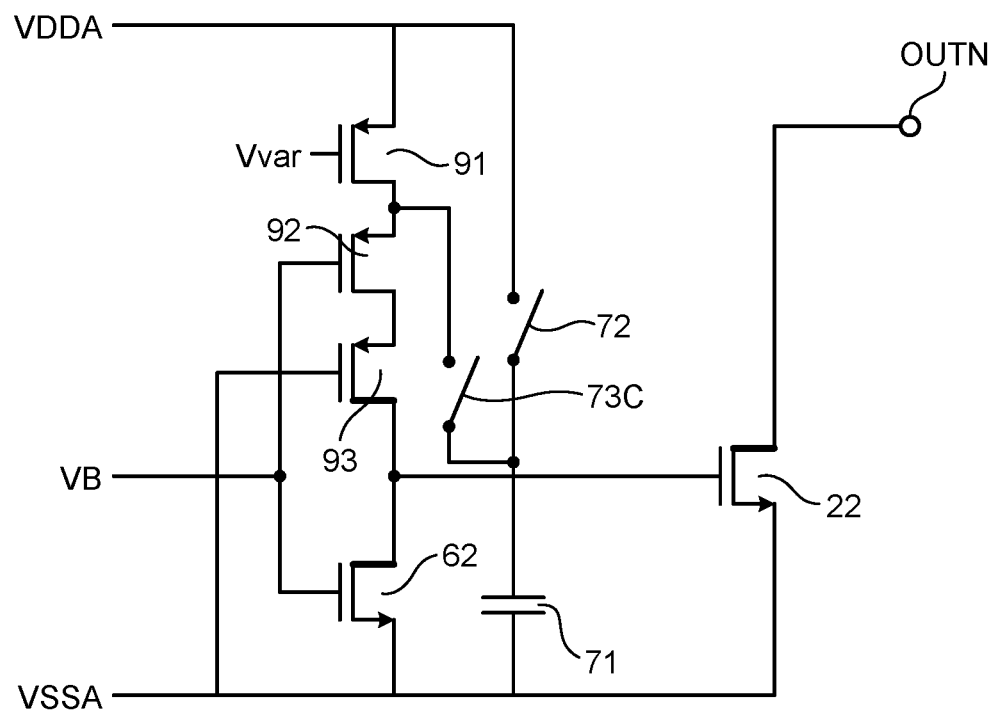
FIG. 14C is a circuit configuration diagram of a main part of still another aspect of the third embodiment.

FIG. 14C is a circuit configuration diagram of a main part of still another aspect of the third embodiment. In FIG. 14C, the same portions as those of the third embodiment in FIG. 14A are denoted by the same reference numerals, and the detailed description thereof is incorporated. Still another aspect of the third embodiment in FIG. 14C is different from the third embodiment in FIG. 14A in that, a charge switch 73C is provided in place of the charge switch 73. The charge switch 73C includes one end connected to the other end (high potential side) of the capacitor 71, and the other end connected to a connection point between the drain terminal of the first P-channel MOS transistor 91 and the source terminal of the second P-channel MOS transistor 92. In this configuration, the operation and effect until the output signal VB of the first PWM power supply VPWMH becomes the "L" level are the same as those of the third embodiment. Therefore, the operation after the output signal VB of the first PWM power supply VPWMH becomes the "L" level will be described.

When the output signal VB of the first PWM power supply VPWMH becomes the "L" level, the N-channel MOS transistor 62 starts to transition to the OFF state (open state) in parallel with the above operation.

Moreover, the charge switch 73C enters the ON state, and the charge charged in the capacitor 71 moves to the gate terminal of the N-channel MOS transistor 22 via the source terminal and the drain terminal of the second P-channel MOS transistor 92, and via the source terminal and the drain terminal of the third P-channel MOS transistor 93. The potential of the gate terminal of the N-channel MOS transistor 22 sharply rises and naturally becomes a potential near the threshold voltage Vth of the N-channel MOS transistor 22 due to the ratio between the capacitance of the capacitor 71 and the capacitance (gate capacitance) of the gate terminal.

Therefore, the driving force can be controlled by the variable current source without performing the feedback control in the driving force limitation period during which the driving force is desired to be limited (the period during which the driving force of the N-channel MOS transistor 22 is desired to be limited) while shortening the period until the gate potential VG of the N-channel MOS transistor 22 becomes the potential near the threshold voltage Vth from 0 volt. In this manner, according to the still another aspect of the third embodiment, the same effects as those of the second embodiment can be obtained like the third embodiment.

(4) Fourth Embodiment

Figure 15A:
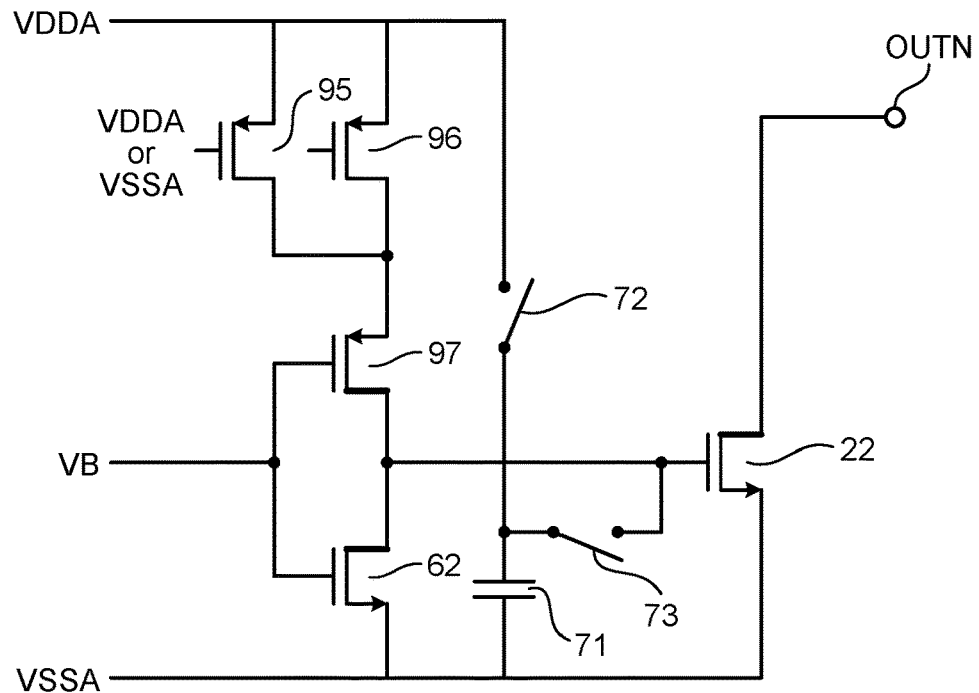
FIG. 15A is a circuit configuration diagram of a main part of a fourth embodiment.

FIG. 15A is a circuit configuration diagram of a main part of a fourth embodiment. In FIG. 15A, the same portions as those in the second basic configuration explanatory diagram of FIG. 3 are denoted by the same reference numerals, and the detailed description thereof is incorporated.

The configuration of the fourth embodiment is different from the second basic configuration in that, a first P-channel MOS transistor 95, a second P-channel MOS transistor 96, and a third P-channel MOS transistor 97 are provided in place of the driving force variable P-channel MOS transistor 61. The first P-channel MOS transistor 95 includes a gate terminal to which either the high-potential-side power supply VDDA or the low-potential-side power supply VSSA is connected in a manner capable of switching. The first P-channel MOS transistor 95 serves as a switching variable current source. The second P-channel MOS transistor 96 is connected in parallel with the first P-channel MOS transistor 95. The second P-channel MOS transistor 96 includes a gate terminal to which either the high-potential-side power supply VDDA or the low-potential-side power supply VSSA is connected in a manner capable of switching. The second P-channel MOS transistor 96 serves as a switching variable current source. A source terminal of the third P-channel MOS transistor 97 is connected to a drain terminal of the first P-channel MOS transistor 95 and a drain terminal of the second P-channel MOS transistor 96. A drain terminal of the third P-channel MOS transistor 97 is connected to a drain terminal of the N-channel MOS transistor 62. The third P-channel MOS transistor 97 includes a gate terminal to which the output signal VB of the first PWM power supply VPWMH is input.

In the above description, the second P-channel MOS transistor 96 is provided in parallel with the first P-channel MOS transistor 95 serving as a switching type variable current source. Alternatively, a configuration that three or more P-channel MOS transistors (at least one of them is a P-channel MOS transistor serving as a variable current source) are connected in parallel can be adopted. This configuration can limit the charge transfer in multiple stages and can more finely control the driving force limitation.

Next, an operation of the fourth embodiment will be described. In this configuration, when the output signal VB of the first PWM power supply VPWMH becomes the "H" level, the precharge switch 72 enters the ON state. Then, the capacitor 71 is charged to the potential of the high-potential-side power supply VDDA (or a desired potential) by the high potential side power supply VDDA. When the time for completing the charge of the capacitor 71 has elapsed, the precharge switch 72 enters the OFF state.

At this time, the "H" level is applied to the gate terminal of the N-channel MOS transistor 62, so that the N-channel MOS transistor 62 is in the ON state (closed state). Then, the gate terminal of the N-channel MOS transistor 22 is in the "L" level, and the N-channel MOS transistor 22 is in the OFF state (open state).

Subsequently, in order to cause the N-channel MOS transistor 22 to transition from the OFF state (open state) to the ON state (closed state), the output signal VB of the first PWM power supply VPWMH is set to the "L" level. As a result, the second P-channel MOS transistor 96 starts to transition to the ON state (closed state), and the N-channel MOS transistor 62 starts to transition to the OFF state (open state).

In this case, the first P-channel MOS transistor 95 and the second P-channel MOS transistor 96 serving as switching type variable current sources are provided between the high-potential-side power supply VDDA and the third P-channel MOS transistor 97. As a result, when the high-potential-side power supply VDDA is connected to the gate terminal of one of the first P-channel MOS transistor 95 and the second P-channel MOS transistor 96 and the gate terminal is at the "H" level, the P-channel MOS transistor enters the OFF state (open state). Therefore, the movement of charges is limited as compared with the normal operation state where the first P-channel MOS transistor 95 and the second P-channel MOS transistor 96 are both in the ON state (closed state).

That is, either one of the first P-channel MOS transistor 95 and the second P-channel MOS transistor 92, and the third P-channel MOS transistor 97 operate in the same manner as the driving force variable P-channel MOS transistor 61. As a result, the driving force is limited, and the potential of the gate of the N-channel MOS transistor 22 gradually transitions to the "H" level.

With this configuration, the N-channel MOS transistor 22 does not suddenly transition to the ON state (closed state). As a result, the power transistors at the subsequent stage of the N-channel MOS transistor 22 do not rapidly transition, the two power transistors constituting the upper arm and the lower arm do not simultaneously enter the ON state (closed state), and the through current does not flow, and therefore, power consumption does not wastefully increase.

When the output signal VB of the first PWM power supply VPWMH becomes the "L" level, the N-channel MOS transistor 62 starts to transition to the OFF state (open state) in parallel with the above operation.

Moreover, the charge switch 73 enters the ON state, and the charge charged in the capacitor 71 moves to the gate terminal of the N-channel MOS transistor 22. Then, the potential of the gate terminal of the N-channel MOS transistor 22 sharply rises and naturally becomes a potential near the threshold voltage Vth of the N-channel MOS transistor 22 due to the ratio between the capacitance of the capacitor 71 and the capacitance (gate capacitance) of the gate terminal.

Therefore, the driving force can be controlled by the variable current source without performing feedback control in the driving force limitation period during which the driving force is desired to be limited (the period during which the driving force of the N-channel MOS transistor 22 is desired to be limited) while shortening the period until the gate potential VG of the N-channel MOS transistor 22 becomes the potential near the threshold voltage Vth from 0 volt. In this manner, according to the fourth embodiment, effects similar to the effects of the first embodiment can be obtained.

(4.1) Another Aspect of Fourth Embodiment

Figure 15B:
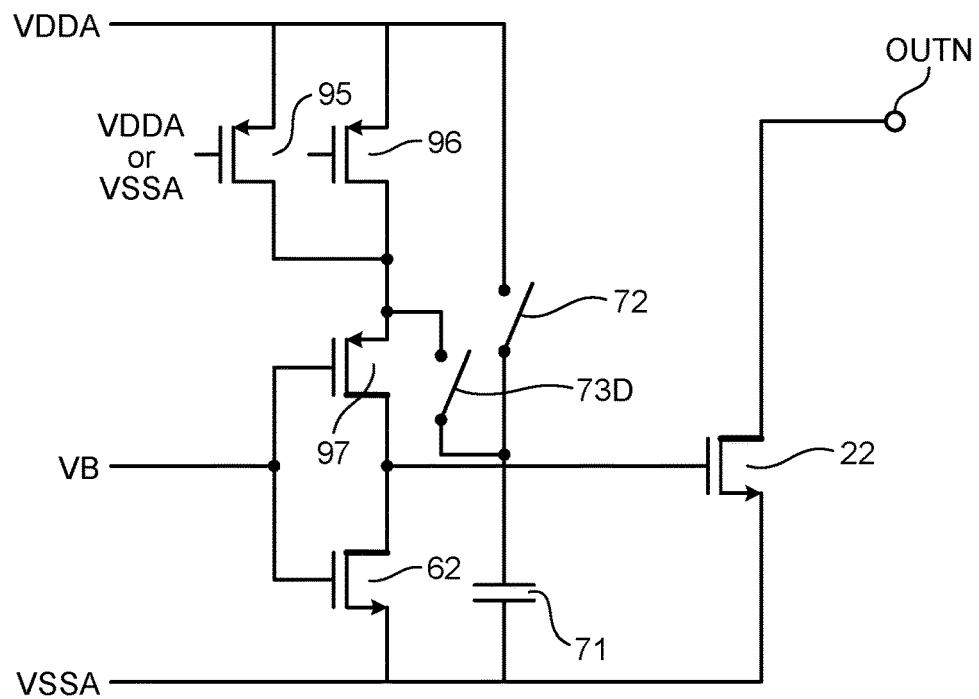
FIG. 15B is a circuit configuration diagram of a main part of another aspect of the fourth embodiment.

FIG. 15B is a circuit configuration diagram of a main part of another aspect of the fourth embodiment. In FIG. 15B, the same portions as those of the fourth embodiment in FIG. 15A are denoted by the same reference numerals, and the detailed description thereof is incorporated. Another aspect of the fourth embodiment in FIG. 15B is different from the fourth embodiment in FIG. 15A in that, a charge switch 73D is provided in place of the charge switch 73. The charge switch 73D includes one end connected to the other end (high potential side) of the capacitor 71, and the other end connected to a connection point between the drain terminal of the second P-channel MOS transistor 96 and the source terminal of the third P-channel MOS transistor 97.

Next, an operation of another embodiment of the fourth embodiment will be described. In this configuration, the operation and effect until the output signal VB of the first PWM power supply VPWMH becomes the "L" level are the same as those of the fourth embodiment. Therefore, the operation after the output signal VB of the first PWM power supply VPWMH becomes the "L" level will be described.

When the output signal VB of the first PWM power supply VPWMH becomes the "L" level, the N-channel MOS transistor 62 starts to transition to the OFF state (open state) in parallel with the above operation.

The charge switch 73D enters the ON state, and the charge charged in the capacitor 71 moves to the gate terminal of the N-channel MOS transistor 22 via the source terminal and the drain terminal of the third P-channel MOS transistor 97. The potential of the gate terminal of the N-channel MOS transistor 22 sharply rises and naturally becomes a potential near the threshold voltage Vth of the N-channel MOS transistor 22 due to the ratio between the capacitance of the capacitor 71 and the capacitance (gate capacitance) of the gate terminal.

Therefore, the driving force can be controlled by the variable current source without performing feedback control in the driving force limitation period during which the driving force is desired to be limited (the period during which the driving force of the N-channel MOS transistor 22 is desired to be limited) while shortening the period until the gate potential VG of the N-channel MOS transistor 22 becomes the potential near the threshold voltage Vth from 0 volt. According to another embodiment of the fourth embodiment, effects similar to the effects of the first embodiment can be obtained.

(5) Modifications of First to Fourth Embodiments (5.1) First Modification

In the above description, the time TD until the gate potential VG of the transistor to be controlled reaches the threshold voltage Vth from 0 volt is not adjusted. In contrast, the first modification is for adjusting the time TD.

Figure 16:
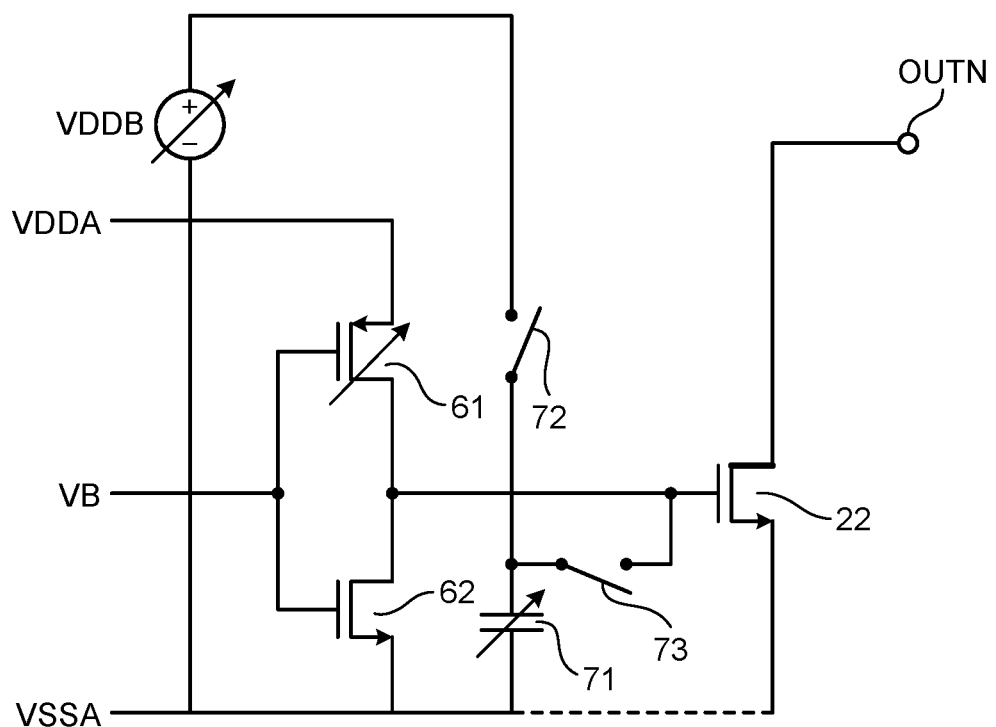
FIG. 16 is an explanatory diagram of a first modification of an embodiment.

FIG. 16 is an explanatory diagram of a first modification of an embodiment. As a method of making the time TD until the gate potential VG of the transistor to be controlled reaches the threshold voltage Vth from 0 volt variable, it is conceivable to adjust the charge Q charged in the capacitor, and for example, the following three methods are conceivable.

As a first method, it is conceivable to configure a power supply connected to the capacitor 71 to be precharged via the precharge switch 72 with a variable voltage source. According to this configuration, by increasing the voltage of the variable voltage source within a possible range, the time TD can be further shortened.

As a second method, it is conceivable to configure the capacitor 71 to be precharged with a variable capacitance capacitor. According to this configuration, the time TD can be further shortened by increasing the capacitance of the variable capacitance capacitor within a possible range.

Both the first method and the second method are combined in FIG. 16, whereas the same effect can be obtained by either one of these methods. As a third method, the time TD can be further shortened by making the current capacity (charge transfer capacity) of the precharge switch or the charge switch variable and increasing the current capacity.

Figure 17:
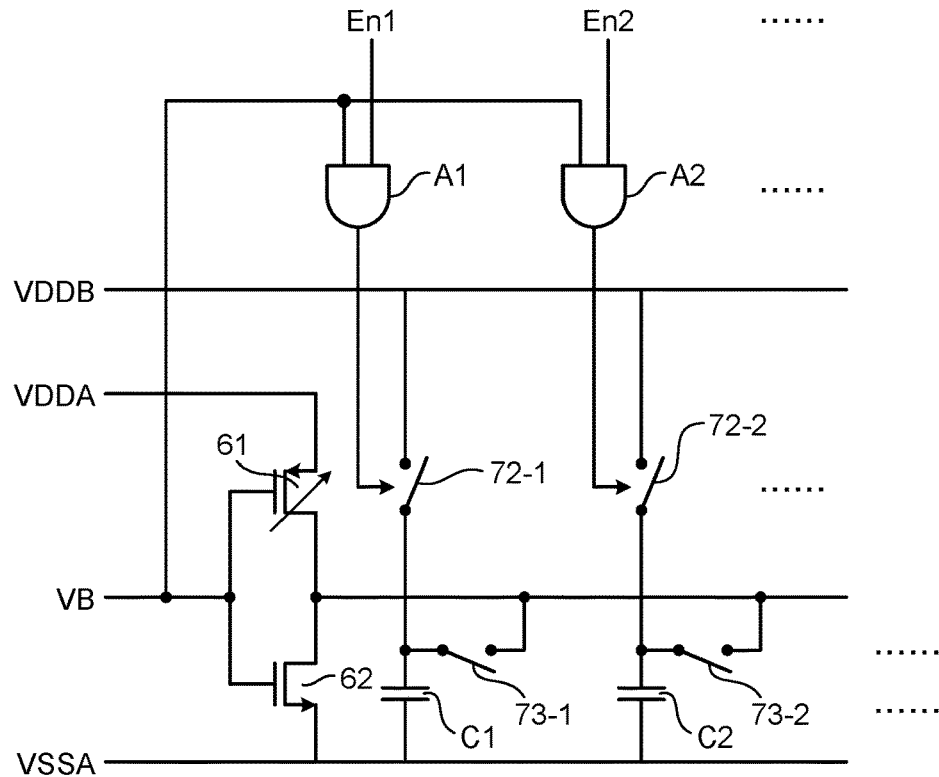
FIG. 17 is an explanatory diagram of a first specific example in a case where a time TD is adjusted by a second method.

FIG. 17 is an explanatory diagram of a first specific example in a case where a time TD is adjusted by a second method. As illustrated in FIG. 17, AND circuits Ax (x=1, 2, . . . ) are provided. Each of the AND circuits Ax includes one input terminal to which the output signal VB of the first PWM power supply VPWMH is input, and the other input terminal to which an enable signal Enx (x=1, 2, . . . ) for one of capacitors Cx (x=1, 2, . . . ) corresponding to the other input terminal is input. Each of the AND circuits Ax connects the corresponding capacitor Cx to the high potential side power supply VDDB by causing a corresponding one of precharge switches 72x (x=1, 2, . . . ) to be in the ON state when the output signal at the "H" level and the enable signal at the "H" level are input.

With the configuration above, by changing a combined capacitance of the capacitors simultaneously connected to the high-potential-side power supply VDDB, the fixed capacitance capacitors is caused to operate as variable capacitance capacitors. The time TD can be shortened as the capacitance of the variable capacitance capacitor is increased.

The precharge switches 72-x (x=1, 2, . . . ) and charge switches 73-x (x=1, 2, . . . ) are each provided to have one-to-one correspondence to the capacitors Cx (x=1, 2, . . . ).

Figure 18:
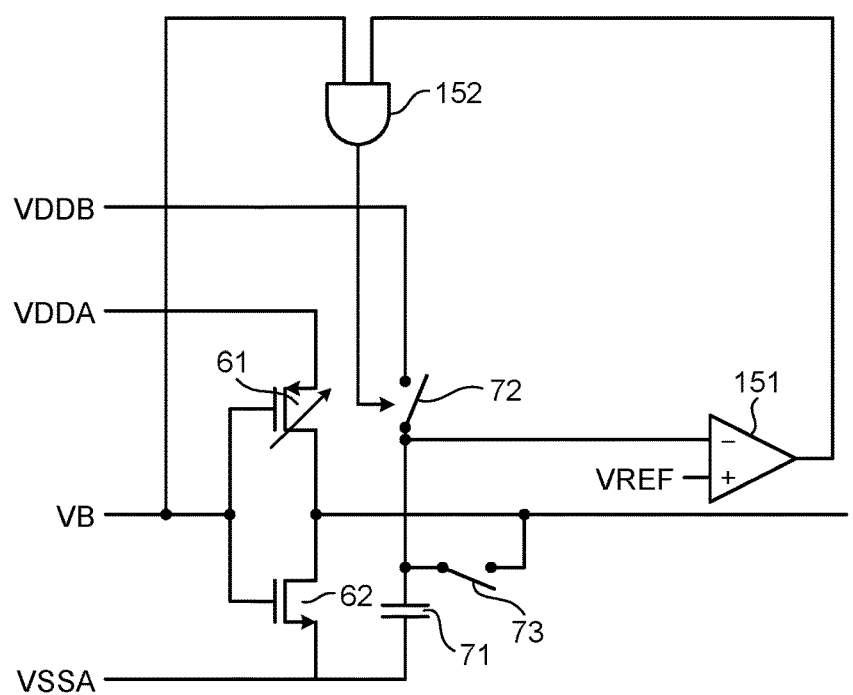
FIG. 18 is an explanatory diagram of a second specific example in a case where the time TD is adjusted by the second method.

FIG. 18 is an explanatory diagram of a second specific example in a case where the time TD is adjusted by the second method. As illustrated in FIG. 18, in the second specific example, a comparator 151 and an AND circuit 152 are provided. The comparator 151 compares the charge voltage of the capacitor 71 with a reference voltage VREF, and outputs a comparison result signal. The AND circuit 152 receives the output signal VA from the first level-shift circuit 23 at one input terminal and receives the comparison result signal from the comparator 151 at the other input terminal. The AND circuit 152 then takes a logical product of those received signals. When the voltage of the capacitor 71 exceeds the set reference voltage VREF, the precharge switch 72 is turned off on the basis of the output result of the AND circuit 152. With this configuration, the capacitance of the capacitor is caused to effectively correspond to the reference voltage VREF, and the reference voltage VREF is changed to make the capacitance of the capacitor effectively variable.

Figure 19:
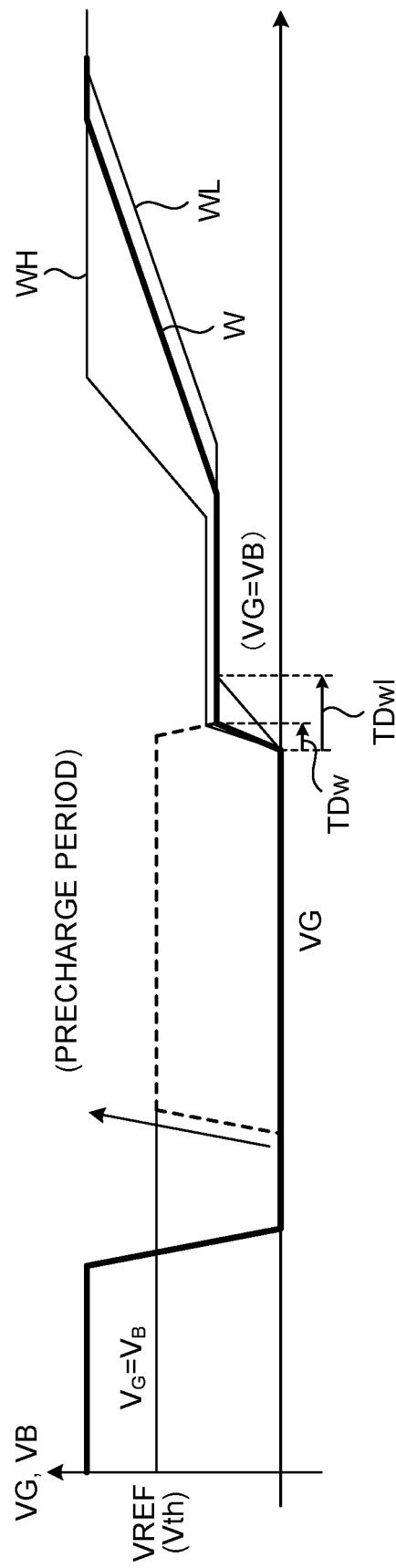
FIG. 19 is an explanatory diagram for making the time TD variable, the time TD being taken for a gate potential VG of a transistor to be controlled to reach the threshold voltage Vth from 0 volt.

FIG. 19 is an explanatory diagram for making the time TD variable, the time TD being taken for a gate potential VG of a transistor to be controlled to reach the threshold voltage Vth from 0 volt. That is, as the effective capacitance of the capacitor C1 is increased, the time TD can be shortened as illustrated in FIG. 19.

More specifically, in comparison with the time TD (TDwl) of a waveform WL corresponding to a related art with a small driving force, the time TD (TDw) of a waveform W according to the second specific example can be shortened. Additionally, the driving force is reliably reduced as compared with a waveform WH with a large driving force, and the operation of the controlled transistor at the subsequent stage is reduced. Therefore, an increase in power consumption and a decrease in reliability can be suppressed.

Figure 20:
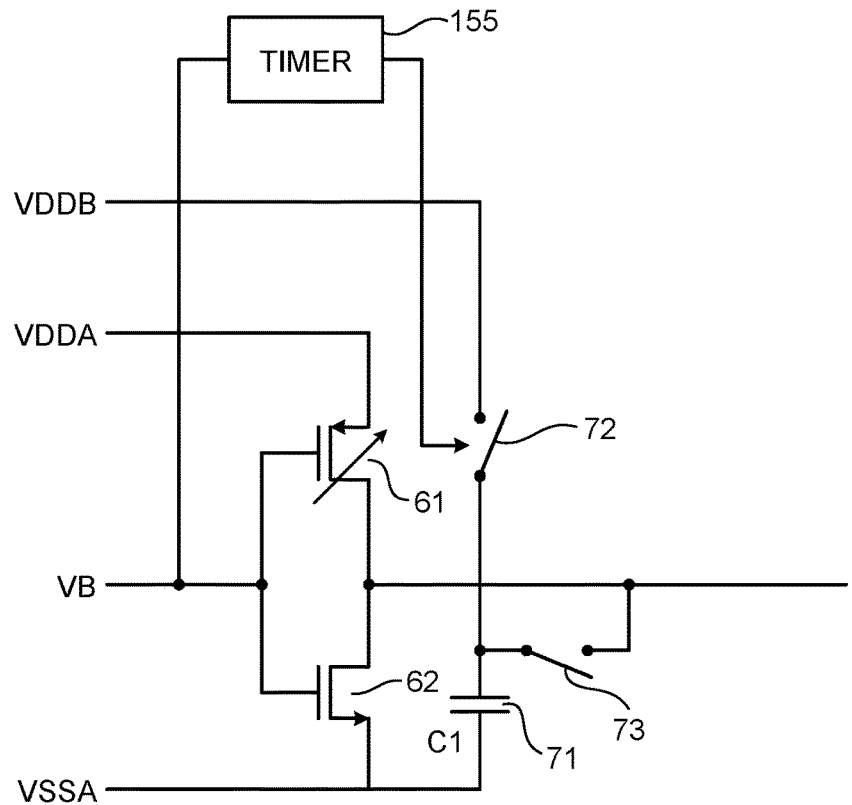
FIG. 20 is an explanatory diagram of a third specific example in a case where the time TD is adjusted by the second method.

FIG. 20 is an explanatory diagram of a third specific example in a case where the time TD is adjusted by the second method. As illustrated in FIG. 20, in the third specific example, a timer 155 serving to control the precharge switch is provided in place of the AND circuit 152 according to the foregoing second specific example. In the third specific example, the output signal VB of the first PWM power supply VPWMH is input to an input terminal of the timer 155. Then, rising of the output signal VB is detected, and the precharge switch 72 is caused to be in the ON state.

Moreover, when the output signal VB of the first PWM power supply VPWMH exceeds the time set in the state of the "H" level, or when the output signal VB becomes the "L" level, the precharge switch 72 is turned off. Therefore, the capacitor C1 is caused to effectively operate as a variable capacitance capacitor.

Also in the third specific example, as illustrated in FIG. 19, the time TD (TDw) of the waveform W can be shortened in comparison with the time TD (TDwl) of the waveform WL corresponding to a related art with a small driving force. Additionally, the driving force is reliably reduced as compared with a waveform WH with a large driving force, and the operation of the controlled transistor at the subsequent stage is reduced. Therefore, an increase in power consumption and a decrease in reliability can be suppressed.

Figure 21:
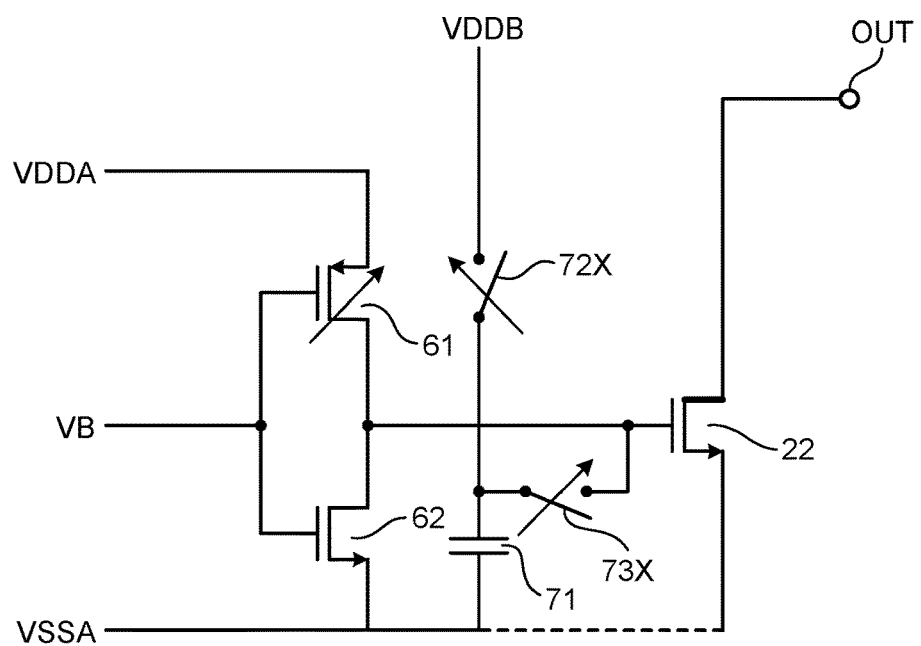
FIG. 21 is an explanatory diagram of a specific example in a case where the time TD is adjusted by a third method.

FIG. 21 is an explanatory diagram of a specific example in a case where the time TD is adjusted by a third method. As illustrated in FIG. 21, the time TD can be made variable by providing a current capacity variable precharge switch 72X in place of the precharge switch 72 or providing a current capacity variable charge switch 73X in place of the charge switch 73 to make the effective precharge voltage or charge voltage variable.

Also in the specific example that the time TD is adjusted by the third method, as illustrated in FIG. 19, the time TD (TDw) of the waveform W can be shortened in comparison with the time TD (TDwl) of the waveform WL corresponding to a related art with a small driving force. Additionally, the driving force is reliably reduced as compared with a waveform WH with a large driving force, and the operation of the controlled transistor at the subsequent stage is reduced. Therefore, an increase in power consumption and a decrease in reliability can be suppressed.

(5.2) Second Modification

In the above description, the case where a normally-off device is used as the transistor to be controlled has been described. The second modification is for a case where a normally-on device is used as the transistor to be controlled, which is an output transistor.

Figure 22:
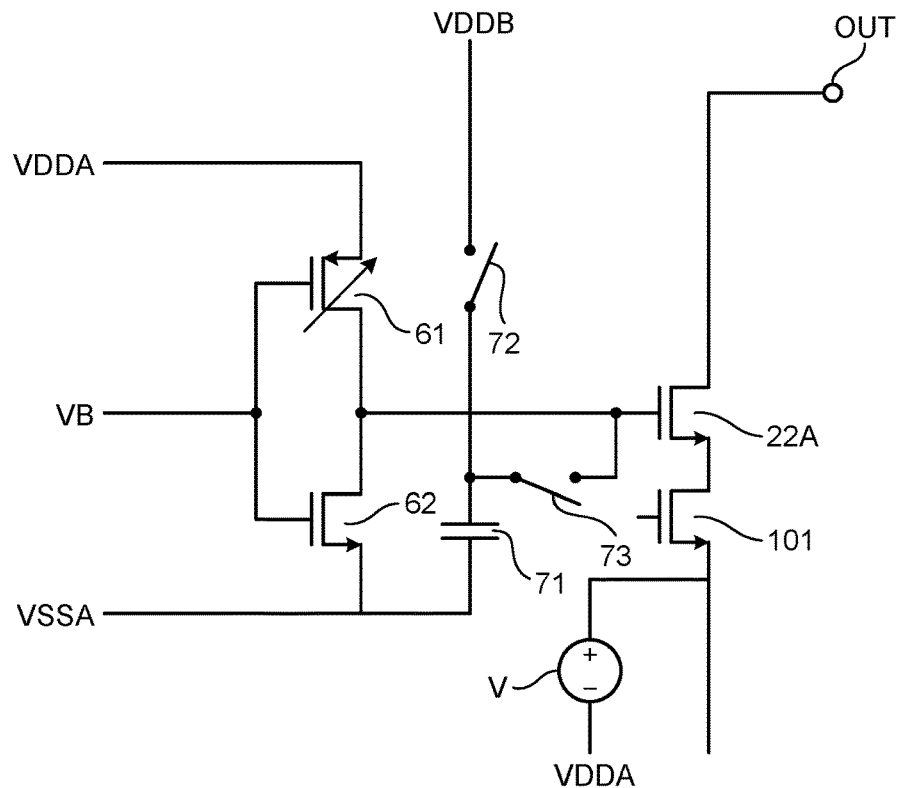
FIG. 22 is an explanatory diagram of a specific example in a case of using a MOSFET when a normally-on device for which a threshold voltage Vth has a negative value is used as a transistor to be controlled and the gate withstand voltage is equal to the drain withstand voltage.

FIG. 22 is an explanatory diagram of a specific example in a case of using a MOSFET when a normally-on device for which a threshold voltage Vth has a negative value is used as a transistor to be controlled and the gate withstand voltage is equal to the drain withstand voltage.

In the example of FIG. 22, an N-channel MOS transistor 22A being a normally-on device is used in place of the N-channel MOS transistor 22. In this example, it is assumed that the driving force variable P-channel MOS transistor 61 and the N-channel MOS transistor 62 are each a transistor whose gate withstand voltage is equal to a drain withstand voltage. In the driving force variable P-channel MOS transistor 61, the drain terminal is connected to the high-potential-side power supply VDDA, the drain terminal is connected to the gate terminal of the N-channel MOS transistor 22A, and the output signal VB of the first PWM power supply VPWMH is input to the gate terminal. In the N-channel MOS transistor 62, the drain terminal is connected to the gate terminal of the N-channel MOS transistor 22A, the source terminal is connected to the low-potential-side power supply VSSA, and the output signal VB of the first PWM power supply VPWMH is input to the gate terminal.

A drain terminal of the low-withstand-voltage N-channel MOS transistor 101 is connected to a source terminal of the N-channel MOS transistor 22A. Moreover, a drive power supply V serving to supply drive power on the basis of the high-potential-side power supply VDDA is connected to a source terminal of the low-withstand-voltage N-channel MOS transistor 101. In this configuration, the low-potential-side power supply VSSA is set to a negative voltage, and the potential of the second high-potential-side power supply VDDB is set to a potential higher than the threshold voltage Vth (<0 V) of the N-channel MOS transistor 22A.

Next, an operation of the second modification will be described. When the output signal VB of the first PWM power supply VPWMH becomes the "H" level, the precharge switch 72 enters the ON state. Then, the capacitor 71 is charged to the potential of the high-potential-side power supply VDDB (or a desired potential) by the second high-potential-side power supply VDDB.

When the time for completing the charge of the capacitor 71 has elapsed, the precharge switch 72 enters the OFF state. At this time, the "H" level is applied to the gate terminal of the N-channel MOS transistor 62, so that the N-channel MOS transistor 62 is in the ON state (closed state). Additionally, the gate terminal of the N-channel MOS transistor 22A is in the "L" level (=VSSA), and the N-channel MOS transistor 22A is in the OFF state (open state).

Subsequently, in order to cause the N-channel MOS transistor 22A to transition from the OFF state (open state) to the ON state (closed state), the output signal VB of the first PWM power supply VPWMH is set to the "L" level.

As a result, the second P-channel MOS transistor 92 starts to transition to the ON state (close state), and the N-channel MOS transistor 62 starts to transition to the OFF state (open state). The P-channel MOS transistor 61 starts transition to the ON state.

The P-channel MOS transistor 61 operates as a variable current source, and movement of charges is limited. As a result, the driving force is limited, and the potential of the gate of the N-channel MOS transistor 22A gradually transitions to the "H" level.

With this configuration, the N-channel MOS transistor 22A does not suddenly transition to the ON state (closed state). Additionally, the power transistors at the subsequent stage of the N-channel MOS transistor 22A do not rapidly transition, the two power transistors constituting the upper arm and the lower arm do not simultaneously enter the ON state (closed state), and the through current does not flow. Therefore, power consumption does not wastefully increase.

When the output signal VB of the first PWM power supply VPWMH becomes the "L" level, the N-channel MOS transistor 62 starts to transition to the OFF state (open state) in parallel with the above operation.

The charge switch 73 enters the ON state, the charge charged in the capacitor 71 moves to the gate terminal of the N-channel MOS transistor 22A. The potential of the gate terminal of the N-channel MOS transistor 22A sharply rises and naturally becomes a potential near the threshold voltage Vth of the N-channel MOS transistor 22A due to the ratio between the capacitance of the capacitor 71 and the capacitance (gate capacitance) of the gate terminal.

Therefore, the driving force control can be performed by the variable current source without performing the feedback control for the driving force limitation period during which the driving force is desired to be limited (the period during which the driving force of the N-channel MOS transistor 22A is desired to be limited) while shortening the period until the gate potential VG of the N-channel MOS transistor 22A becomes the potential in the vicinity of the threshold voltage Vth higher than the potential of the low-potential side power supply VSSA. Then, when the driving force limitation period elapses, the N-channel MOS transistor 22A is caused to transition to the ON state. Then, a current flows to the source terminal via the drain terminal of the low-withstand-voltage N-channel MOS transistor 101, and the potential of the output terminal OUT becomes the "L" level. Therefore, the same effects as those of the first embodiment can be obtained also in the second modification.

(5.3) Third Modification

In the second modification described above, a normally-on device whose threshold voltage Vth is a negative value is used as the transistor to be controlled, and a MOSFET that the gate withstand voltage is equal to the drain withstand voltage is used. In the third modification, a normally-on device whose threshold voltage Vth is a negative value is used as the transistor to be controlled, whereas the gate withstand voltage is very low with respect to the drain withstand voltage.

Figure 23:
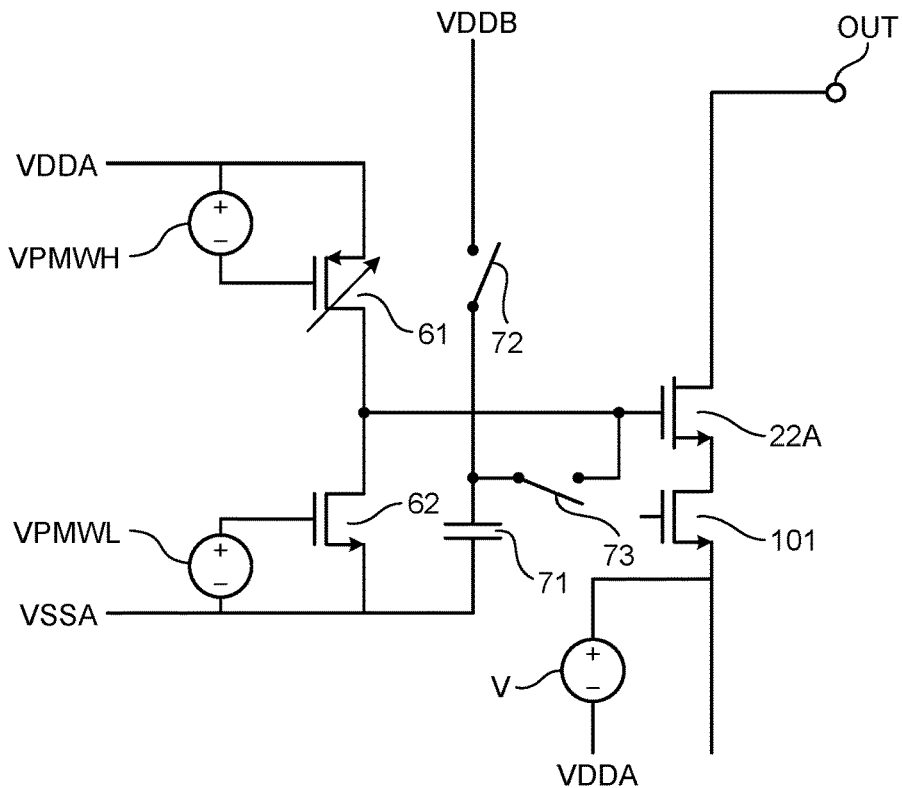
FIG. 23 is an explanatory diagram of a specific example in a case where a normally-on device is used as a transistor to be controlled and the gate withstand voltage is very low with respect to the drain withstand voltage.

FIG. 23 is an explanatory diagram of a specific example in a case where a normally-on device is used as a transistor to be controlled and the gate withstand voltage is very low with respect to the drain withstand voltage. In FIG. 23, the same reference numerals are assigned to the same portions as those of the second modification of FIG. 22.

In the driving force variable P-channel MOS transistor 61, a source terminal is connected to the high-potential-side power supply VDDA, and a drain terminal is connected to the gate terminal of the N-channel MOS transistor 22A. In addition, a gate terminal of the P-channel MOS transistor 61 is connected to a high-potential-side power supply PWMH in place of the output signal VA of the first level-shift circuit 23. The high-potential-side power supply PWMH applies a potential corresponding to the withstand voltage (gate withstand voltage) of the gate terminal of the N-channel MOS transistor 22A.

In the same manner, in the N-channel MOS transistor 62, a drain terminal is connected to the gate terminal of the N-channel MOS transistor 22A, and a source terminal is connected to the low-potential-side power supply VSSA. A gate terminal of the N-channel MOS transistor 62 is connected to a low-potential-side power supply PWML in place of the output signal VB of the first PWM power supply VPWMH. The low-potential-side power supply PWML applies a potential corresponding to the withstand voltage (gate withstand voltage) of the gate terminal of the N-channel MOS transistor 22A.

The operation of the third modification is the same as that of the second modification, with exception that, when the N-channel MOS transistor 22A is caused to transition to the ON state, a potential (=a potential of the high-potential-side power supply VDDA— a potential of the high-potential-side power supply VPWMH) corresponding to the withstand voltage (gate withstand voltage) of the gate terminal of the N-channel MOS transistor 22A is applied as the gate potential by the high-potential side power supply VPWMH via the P-channel MOS transistor 61. In addition, when the N-channel MOS transistor 22A is caused to transition to the OFF state, a potential (=a potential of the low-potential-side power supply VSSA+a potential of the low-potential-side power supply VPWML) corresponding to the withstand voltage (gate withstand voltage) of the gate terminal of the N-channel MOS transistor 22A is applied as the gate potential by the low-potential side power supply VPWML via the N-channel MOS transistor 62. Therefore, the same effects as those of the first embodiment can be obtained also in the third modification.

(5.4) Fourth Modification

Figure 24:
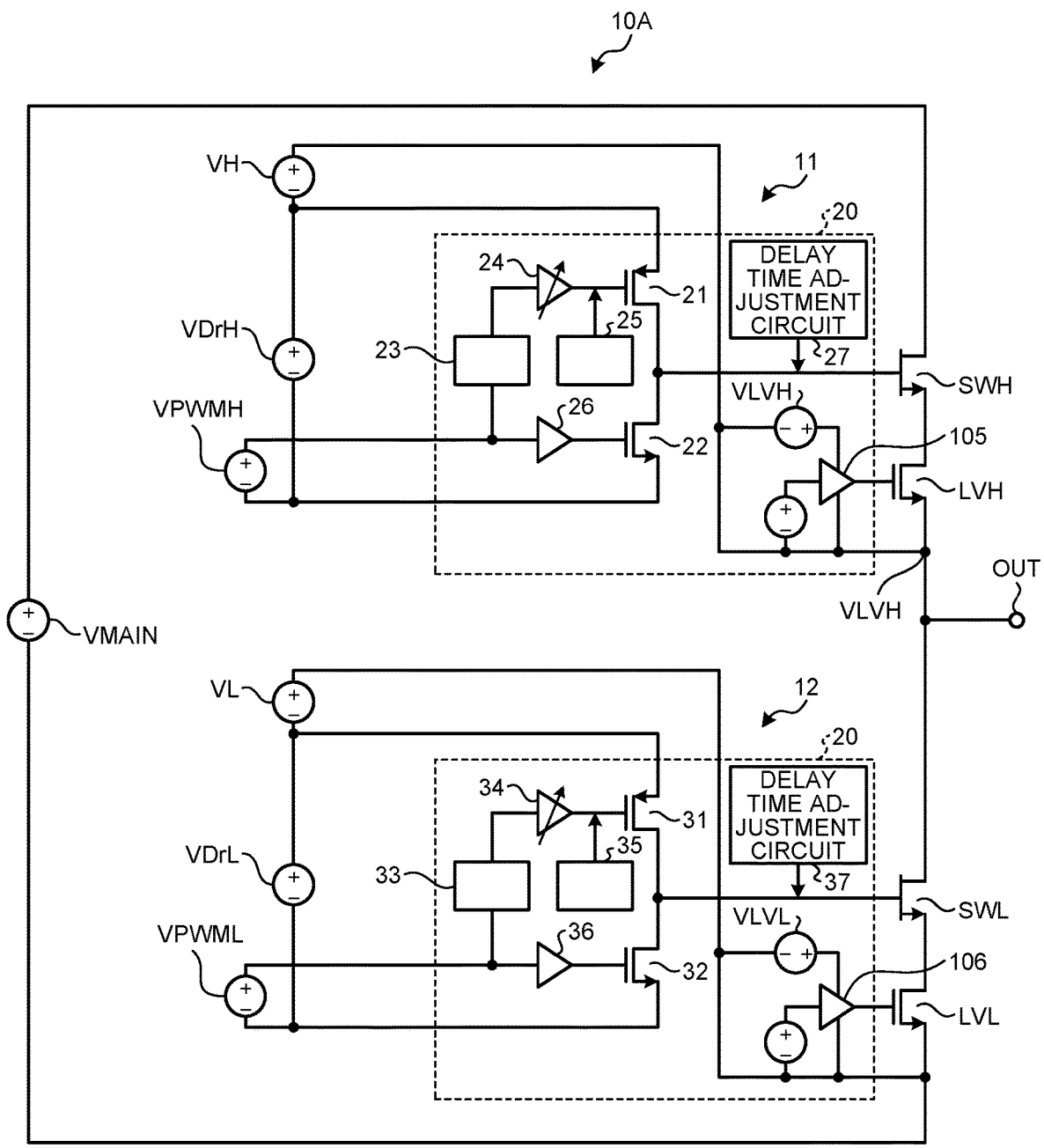
FIG. 24 is a schematic configuration block diagram of a transistor driver circuit according to a fourth modification.

FIG. 24 is a schematic configuration block diagram of a transistor driver circuit according to a fourth modification. In FIG. 24, the same reference numerals are assigned to the same portions as those in FIG. 1. A transistor driver circuit 10A is different from the transistor driver circuit of FIG. 1 in that, as in the above-described second modification and the third modification, the transistor driver circuit 10A includes a drive amplifier 105 and a drive amplifier 106. The drive amplifier 105 is provided with a high-potential-side low-withstand-voltage N-channel MOS transistor LVH between a high-potential-side switch SWH (=output transistor) configured as a normally-on device and an output terminal OUT. The drive amplifier 105 drives a high-potential-side power supply VLVH that generates a predetermined potential from the potential of the high-potential-side power supply VH and a high-potential-side low-withstand-voltage N-channel MOS transistor LVH by receiving power supply from the high-potential-side power supply VLVH to apply a potential corresponding to the gate withstand voltage of the high-potential-side switch SWH to the gate terminal of the high-potential-side low-withstand-voltage N-channel MOS transistor LVH. The drive amplifier 106 is provided with a low potential-side low-withstand-voltage N-channel MOS transistor LVL between a low-potential-side switch SWL (output transistor) configured as a normally-on device and output terminal OUT. The drive amplifier 106 drives a low-potential-side power supply VLVL that generates a predetermined potential from the potential of the low potential-side power supply VL and a low-potential-side low-withstand-voltage N-channel MOS transistor LVL by receiving power supply from the low-potential-side power supply VLVL to apply a potential corresponding to the gate withstand voltage of the low-potential-side switch SWL to the gate terminal of the low-potential-side low-withstand-voltage N-channel MOS transistor LVL.

The operation is the same as that of the second modification and the third modification. Therefore, according to the fourth modification, even when the high-potential-side switch SWH and the low-potential-side switch SWL configured as the normally-on devices are used as the output transistors, the same effects as the effects of the first embodiment can be obtained.

(5.5) Fifth Modification

In each of the above embodiments and modifications, the delay-time adjustment circuit is used for controlling the potential of the gate terminal of the output transistor, but there is a possibility that the same problem as the output transistor occurs also in the transistor to be controlled that is provided at the subsequent stage of the output transistor.

Therefore, in the fifth modification, in addition to the potential control of the gate terminal of the output transistor, a second delay-time adjustment circuit is provided to perform the potential control of the gate terminal of the controlled transistor in the subsequent stage.

Figure 25:
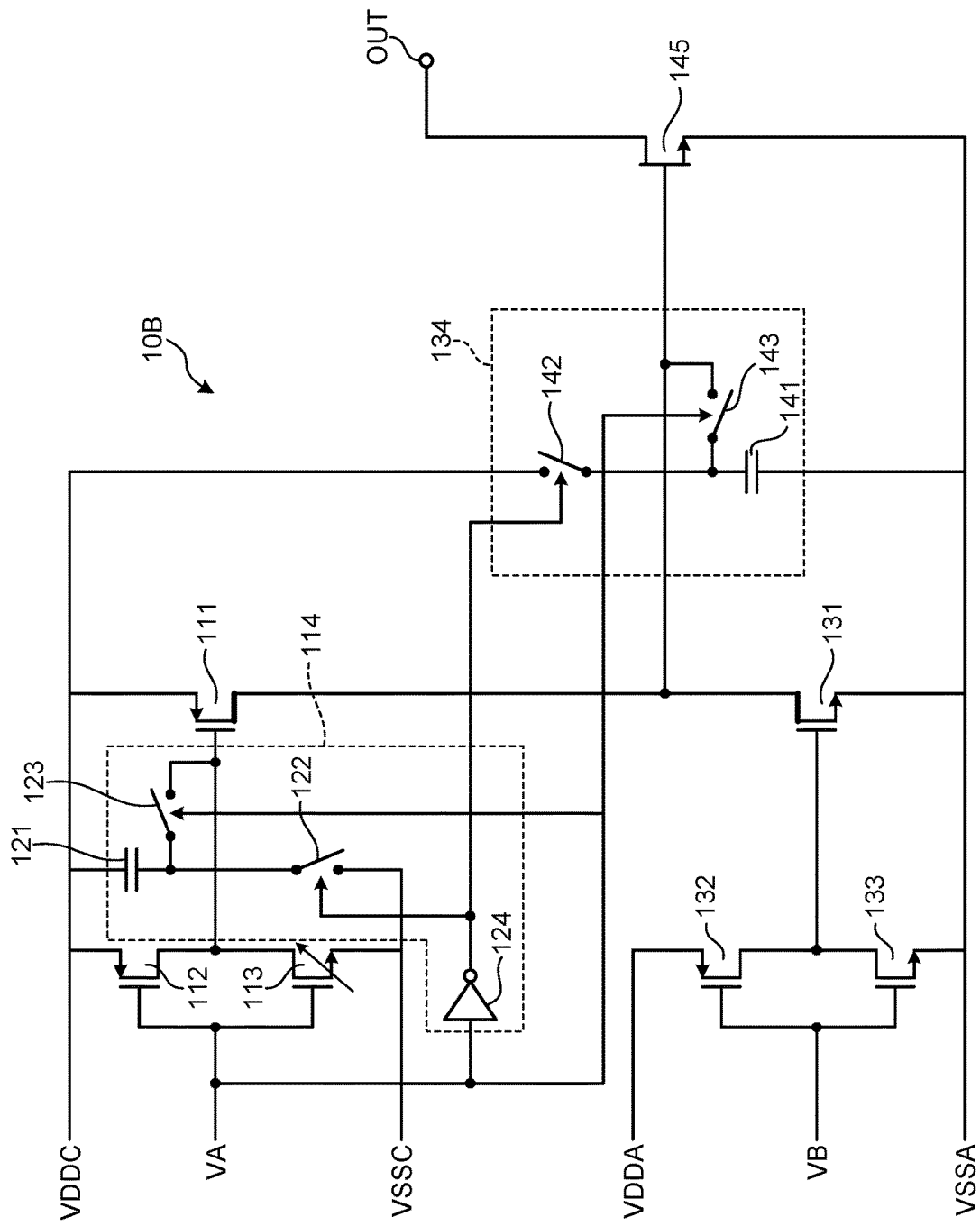
FIG. 25 is a schematic configuration block diagram of a transistor driver circuit according to a fifth modification.

FIG. 25 is a schematic configuration block diagram of a transistor driver circuit according to a fifth modification. In FIG. 25, a transistor driver circuit 10B includes a P-channel MOS transistor 111, a P-channel MOS transistor 112, a driving force variable N-channel MOS transistor 113, and a first delay-time adjustment circuit 114. The P-channel MOS transistor 111 serves as an output transistor. The P-channel MOS transistor 112 includes a source terminal connected to a high-potential-side power supply VDDC, a drain terminal connected to a gate terminal of the P-channel MOS transistor 111, and a gate terminal to which the output signal VA of the first level-shift circuit 23 is input. The driving force variable N-channel MOS transistor 113 includes a drain terminal connected to a gate terminal of the P-channel MOS transistor 111, a source terminal connected to a low-potential-side power supply VSSC, and a gate terminal to which the output signal VA of the first level-shift circuit 23 is input.

The first delay-time adjustment circuit 114 includes a capacitor 121, a first precharge switch 122, a first charge switch 123, and an inverter 124. The capacitor 121 includes one end connected to the high-potential-side power supply VDDC. The first precharge switch 122 includes one end connected to the other end of the capacitor 121, and the other end connected to the low-potential-side power supply VSSC. An inverted output signal/VA that is an inverted signal of an output signal VA of the first level-shift circuit 23 is input to the first precharge switch 122 as a control signal. The first charge switch 123 includes one end connected to the other end of the capacitor 121, and the other end connected to a gate terminal of a P-channel MOS transistor 111. The output signal VA of the first level-shift circuit 23 is input to the first charge switch 123 as a control signal. The inverter 124 includes an input terminal to which the output signal VA of the first level-shift circuit 23 is input. The inverter 124 servers to invert and output the inverted output signal VA as an inverted output signal/VA.

The transistor driver circuit 10B includes an N-channel MOS transistor 131, a P-channel MOS transistor 132, an N-channel MOS transistor 133, and a second delay-time adjustment circuit 134. The N-channel MOS transistor 131 serves as an output transistor. The P-channel MOS transistor 132 includes a source terminal connected to the high-potential-side power supply VDDA, a drain terminal connected to the gate terminal of the N-channel MOS transistor 131, and a gate terminal to which the output signal VB of the first PWM power supply VPWMH is input. The N-channel MOS transistor 133 includes a drain terminal connected to the gate terminal of the N-channel MOS transistor 131, a source terminal connected to the low-potential-side power supply VSSA, and a gate terminal to which the output signal VB of the first PWM power supply VPWMH is input.

The second delay-time adjustment circuit 134 includes a capacitor 141, a second precharge switch 142, and a second charge switch 143. The capacitor 141 includes one end connected to the low-potential-side power supply VSSA. The second precharge switch 142 includes one end connected to the other end of the capacitor 141, and the other end connected to the high-potential-side power supply VDDC. The inverted output signal/VA is input to the second precharge switch 142 as a control signal. The second charge switch 143 includes one end connected to the other end of the capacitor 141, and the other end connected to, for example, a gate terminal of an N-channel MOS transistor 145 which is a transistor to be controlled in a subsequent stage. The output signal VA of the first level-shift circuit 23 is input to the second charge switch 143 as a control signal.

Next, an operation of the fifth modification will be described. When the output signal VA of the first level-shift circuit 23 becomes the "L" level, the inverter 124 inverts the output signal VA and outputs the inverted output signal/VA as the "H" level to the first precharge switch 122 and the second precharge switch 142.

This causes the first precharge switch 122 to enter the ON state and the capacitor 121 to be charged to the potential (or desired potential) of the low-potential-side power supply VSSC by the low-potential-side power supply VSSC.

When the charging of the capacitor 121 is completed, the first precharge switch 122 enters the OFF state. In addition, the second precharge switch 142 enters the ON state, and the capacitor 141 is charged to the potential of the high-potential-side power supply VDDA (or a desired potential) by the high-potential-side power supply VDDA.

When the charging of the capacitor 141 is completed, the second precharge switch 142 enters the OFF state.

At this time, the "L" level is applied to the gate terminal of the P-channel MOS transistor 132, so that the P-channel MOS transistor 132 enters the ON state (closed state). Since the "L" level is applied to the gate terminal of the N-channel MOS transistor 133, the gate terminal of the N-channel MOS transistor 133 enters the OFF state (open state), and the N-channel MOS transistor 131 as an output transistor is in the ON state. As a result, the N-channel MOS transistor 145 which is a transistor to be controlled in the subsequent stage is in the OFF state (open state).

Subsequently, the transistor driver circuit 10B sets the output signal VA of the first level-shift circuit 23 to the "H" level and simultaneously sets the output signal VB of the first PWM power supply VPWMH to the "H" level to cause the P-channel MOS transistor 111 to transition from the OFF state (open state) to the ON state (closed state) and to cause the N-channel MOS transistor 145, which is a transistor to be controlled in the subsequent stage, to transition from the OFF state (open state) to the ON state (closed state).

As a result, the P-channel MOS transistor 112 starts to transition to the OFF state (open state). In addition, the N-channel MOS transistor 113 starts transition to the ON state (closed state). At this time, the inverted output signal/VA, which is the output signal of the inverter 124, becomes the "L" level, and the first precharge switch 122 and the second precharge switch 142 enter the OFF state.

The output signal VA of the first level-shift circuit 23 is at the "H" level, so that the first charge switch 123 and the second charge switch 143 enter the ON state.

The N-channel MOS transistor 113 serving as a variable current source is provided between the low-potential-side power supply VSSC and the gate terminal of the P-channel MOS transistor 111, and movement of charges is limited. Therefore, the driving force of the P-channel MOS transistor 111 is limited by the N-channel MOS transistor 113, and the potential of the gate of the P-channel MOS transistor 111 gradually transitions to the "L" level.

With this configuration, the P-channel MOS transistor 111 does not suddenly transition to the ON state (closed state). As a result, the transistor (power transistor) 145 to be controlled at the subsequent stage of the P-channel MOS transistor 111 does not suddenly transition. Therefore, the two power transistors constituting the upper arm and the lower arm do not simultaneously enter the ON state (closed state), and the through current does not flow. Thus, power consumption does not wastefully increase.

Moreover, the first charge switch 123 enters the ON state, the charge at the gate terminal of the P-channel MOS transistor 111 is discharged to the capacitor 121 and moved, and the potential at the gate terminal of the P-channel MOS transistor 111 sharply decreases. Then, due to the ratio between the capacitance of the capacitor 121 and the capacitance of the gate terminal (gate capacitance), the potential naturally becomes a potential in the vicinity of the threshold voltage Vth of the P-channel MOS transistor 111.

Therefore, the driving force control can be performed by the variable current source without performing feedback control for the driving force limitation period during which the driving force is desired to be limited (the period during which the driving force of the P-channel MOS transistor 111 is desired to be limited) while shortening the period until the gate potential VG of the P-channel MOS transistor 111 reaches the potential near the threshold voltage Vth from the high-potential-side power supply VDDC.

In the same manner, since the output signal VA of the first level-shift circuit 23 is at the "H" level, the second charge switch 143 enters the ON state, and the charge of the capacitor 141 moves to the gate terminal of the N-channel MOS transistor 145. As a result, the potential of the gate terminal of the N-channel MOS transistor 145 sharply rises and naturally becomes a potential near the threshold voltage Vth of the N-channel MOS transistor 151 due to the ratio between the capacitance of the capacitor 141 and the capacitance (gate capacitance) of the gate terminal.

As a result, the driving force can be controlled by the variable current source without performing feedback control for the driving force limitation period during which the driving force is desired to be limited (the period during which the driving force of the N-channel MOS transistor 151 is desired to be limited) while shortening the period until the gate potential VG of the N-channel MOS transistor 145 reaches the potential near the threshold voltage Vth from the low-potential-side power supply VSSA.

Therefore, it is possible to perform the driving force control without performing feedback control for the driving force limitation period (a period during which it is desired to limit the driving force of the N-channel MOS transistor 151 and further suppress the operation of the subsequent transistor) where it is desired to limit the driving force while shortening the period until the gate potential VG of the N-channel MOS transistor 151 becomes the potential near the threshold voltage Vth from the voltage of the low-potential-side power supply VSSA. Therefore, also in the fifth modification, the same effects as the effects of the first embodiment can be obtained not only for the output transistor but also for the transistor to be controlled in the subsequent stage.

(5.6) Sixth Modification

In each of the above embodiments and modifications, the case where the precharge switch and the charge switch are used as the delay-time adjustment circuit has been described, but the sixth modification is a case where a charge pump is used in place of the precharge switch and the charge switch.

Figure 26:
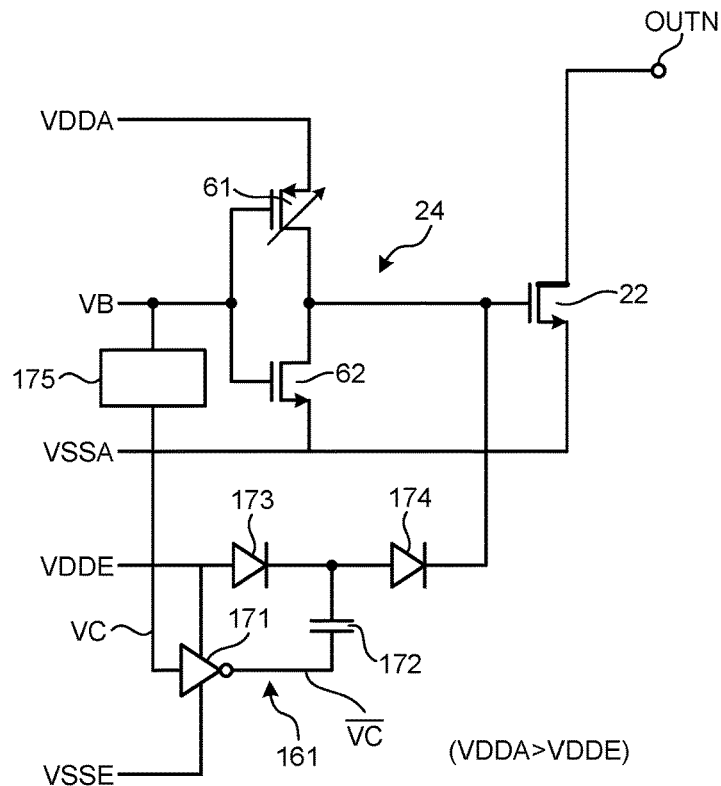
FIG. 26 is a schematic configuration block diagram of a transistor driver circuit using a charge pump of a sixth modification.

FIG. 26 is a schematic configuration block diagram of a transistor driver circuit using a charge pump of a sixth modification. In FIG. 26, the same portions as those in the second basic configuration explanatory diagram of the embodiment of FIG. 3 are denoted by the same reference numerals.

In FIG. 26, the first variable amplifier 24 includes a driving force variable P-channel MOS transistor 61 and an N-channel MOS transistor 62. The driving force variable P-channel MOS transistor 61 includes a source terminal connected to a high-potential-side power supply VDDA, a drain terminal connected to the gate terminal of the N-channel MOS transistor 22, and a gate terminal to which the output signal VB of the first PWM power supply VPWMH is input. The N-channel MOS transistor 62 includes a drain terminal connected to the gate terminal of the N-channel MOS transistor 22, a source terminal connected to the low-potential-side power supply VSSA, and a gate terminal to which the output signal VB of the first PWM power supply VPWMH is input.

The delay-time adjustment circuit 161 is configured as a charge pump circuit. The delay-time adjustment circuit 161 includes an inverter 171, a capacitor 172, a precharge diode 173, and a charge diode 174. The inverter 171 is connected to an intermediate potential power supply VDDE (<high potential side power supply VDDA) as a high potential side power supply, and connected to a low-potential-side power supply VSSE. An output signal VC of a third level-shift circuit 175 is input to the inverter 171. The inverter 171 inverts the output signal VC and outputs an inverted output signal/VC. The capacitor 172 includes one end connected to an output terminal of the inverter 171. The precharge diode 173 includes an anode terminal connected to the intermediate potential power supply VDDE, and a cathode terminal connected to the other end of the capacitor 172. The charge diode 174 includes an anode terminal connected to a cathode terminal of the precharge diode 173, and a cathode terminal connected to a gate terminal of the N-channel MOS transistor 22.

Next, an operation of the sixth modification will be described. First, the transistor driver circuit 10 sets the output signal VB of the first PWM power supply VPWMH to the "H" level. As a result, the P-channel MOS transistor 61 starts to transition to the OFF state (open state), and the N-channel MOS transistor 62 starts to transition to the ON state (closed state).

In parallel with the above operation, the inverter 171 inverts the output signal VC and outputs the inverted output signal/VC.

Since the potential of the output terminal of the inverter 171 at this time is the potential of the low-potential-side power supply VSSE, the capacitor 172 is charged to the potential of the intermediate potential power supply VDDE via the precharge diode 173. When the potential of the capacitor 172 becomes the potential of the intermediate potential power supply VDDE, the precharge ends.

Subsequently, when the output signal VB of the first PWM power supply VPWMH becomes the "L" level, the P-channel MOS transistor 61 starts to transition to the ON state (closed state), and the N-channel MOS transistor 62 starts to transition to the OFF state (open state). In this case, since the driving force of the P-channel MOS transistor 61 is limited, the potential of the gate of the N-channel MOS transistor 22 gradually transitions to the "H" level.

Therefore, the N-channel MOS transistor 22 does not suddenly transition to the ON state (closed state). As a result, the power transistor at the subsequent stage does not rapidly transition.

The potential of the output terminal of the inverter 171 at this time is substantially equal to the potential of the intermediate potential power supply VDDE. The potential at the other end of the capacitor 172 is substantially equal to a potential obtained by adding a voltage equal to a difference between the potential of the intermediate potential power supply VDDE and the potential of the low-potential-side power supply VSSA to the intermediate potential power supply VDDE. That is, the potential at the other end of the capacitor 172 becomes a value VDDE+(VDDE−VSSA).

Therefore, the charge charged in the capacitor 172 is supplied to the gate terminal of the N-channel MOS transistor 22, the potential of the gate terminal of the N-channel MOS transistor 22 sharply rises and naturally becomes a potential in the vicinity the threshold voltage Vth of the N-channel MOS transistor 22 due to the ratio between the capacitance of the capacitor 172 and the capacitance (gate capacitance) of the gate terminal of the N-channel MOS transistor 22.

Therefore, a high-speed driving is performed in the period until the gate potential VG of the N-channel MOS transistor 22 reaches the potential near the threshold voltage Vth from the potential of the low-potential-side power supply VSSA, and the driving force can be controlled with the current source without performing feedback control in the driving force limitation period during which the driving force is desired to be limited (period during which the driving force of the N-channel MOS transistor 22 is desired to be limited).

According to the sixth modification, the same effects as that of the first embodiment can be obtained.

(5.7) Seventh Modification

A seventh modification uses a charge pump in place of the precharge switch and the charge switch as in the sixth modification.

Figure 27:
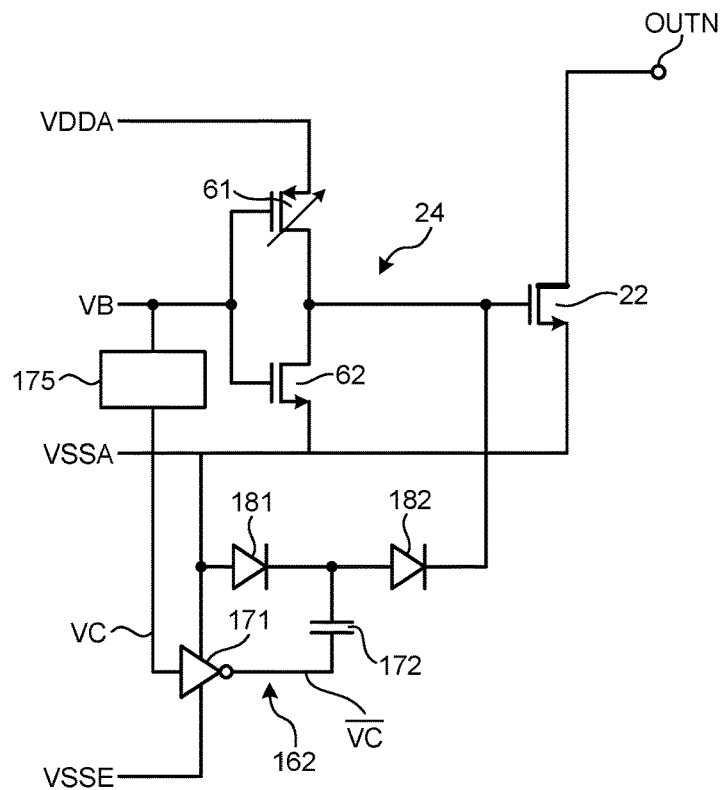
FIG. 27 is a schematic configuration block diagram of a transistor driver circuit using a charge pump of a seventh modification.

FIG. 27 is a schematic configuration block diagram of a transistor driver circuit using a charge pump of a seventh modification. In FIG. 27, the same reference numerals are assigned to the same portions as those of the sixth modification of FIG. 25.

In FIG. 27, the delay-time adjustment circuit 162 is configured as a charge pump circuit. The delay-time adjustment circuit 162 includes an inverter 171, a capacitor 172, a precharge diode 181, and a charge diode 182. The inverter 171 is connected to a low-potential-side power supply VSSA as a high-potential-side power supply, and connected to a low-potential-side power supply VSSE (<low-potential-side power supply VSSA) as a low-potential-side power supply. An output signal VC of the third level-shift circuit 175 is input to an input terminal of the inverter 171. The inverter 171 inverts the output signal VC and outputs an inverted output signal/VC. The capacitor 172 includes one end connected to an output terminal of the inverter 171. The precharge diode 181 includes an anode terminal connected to an intermediate potential power supply VDDE, and a cathode terminal connected to the other end of the capacitor 172. The charge diode 182 includes an anode terminal connected to a cathode terminal of the precharge diode 173, and a cathode terminal connected to a gate terminal of the N-channel MOS transistor 22.

Next, an operation of the seventh modification will be described. First, the transistor driver circuit 10 sets the output signal VB of the first PWM power supply VPWMH to the "H" level. As a result, the P-channel MOS transistor 61 starts to transition to the OFF state (open state), and the N-channel MOS transistor 62 starts to transition to the ON state (closed state).

In parallel with the above operation, the inverter 171 inverts the output signal VC and outputs the inverted output signal/VC. The potential of the output terminal of the inverter 171 at this time is the potential of the low-potentialside power supply VSSE. Thus, the capacitor 172 is charged to the potential of the low-potential-side power supply VSSA as the high-potential-side power supply via the precharge diode 181.

When the potential of the capacitor 172 becomes the potential of the low-potential-side power supply VSSA, the precharge ends.

Subsequently, when the output signal VB of the first PWM power supply VPWMH becomes the "L" level, the P-channel MOS transistor 61 starts to transition to the ON state (closed state), and the N-channel MOS transistor 62 starts to transition to the OFF state (open state). In this case, since the driving force of the P-channel MOS transistor 61 is limited, the potential of the gate of the N-channel MOS transistor 22 gradually transitions to the "H" level.

Therefore, the N-channel MOS transistor 22 does not suddenly transition to the ON state (closed state). As a result, the power transistor at the subsequent stage does not rapidly transition.

The potential at the other end of the capacitor 172 at this time is substantially equal to a potential obtained by adding a voltage equal to a difference between the potential of the low-potential-side power supply VSSA and the potential of the low-potential-side power supply VSSE to the potential of the low-potential-side power supply VSSA. That is, the potential at the other end of the capacitor 172 becomes a value≈VSSA+(VSSA−VSSE). Therefore, the potential of the gate terminal of the N-channel MOS transistor 22 sharply rises and naturally becomes a potential in the vicinity of the threshold voltage Vth of the N-channel MOS transistor 22 due to the ratio between the capacitance of the capacitor 172 and the capacitance (gate capacitance) of the gate terminal of the N-channel MOS transistor 22.

Therefore, a high-speed driving is performed in the period until the gate potential VG of the N-channel MOS transistor 22 reaches the potential near the threshold voltage Vth from the potential of the low-potential-side power supply VSSA, and the driving force can be controlled with the current source without performing feedback control in the driving force limitation period during which the driving force is desired to be limited (period during which the driving force of the N-channel MOS transistor 22 is desired to be limited).

According to the seventh modification as well, the same effects as that of the first embodiment can be obtained.

(6) Fifth Embodiment

In the driving force limitation circuit of the gate driver of each of the above embodiments, it is effective to increase the speed of the final stage of the driver by charging up to the voltage determined by the capacitance ratio at high speed and reducing the propagation delay. However, when the load capacitance (load gate capacitance) to be driven is large, it is necessary to use a large capacitance. For example, the gate capacitance of a power element is about 10 nF. In such a case, a method of using an external capacitance is conceivable, but it is desirable to reduce the number of external components and suppress the parasitic inductance of the external capacitance, and it is desirable to configure the circuit with components that can be incorporated.

Therefore, in a fifth embodiment, discharge power of a capacity that can be incorporated is amplified by a current mirror circuit in place of a large external capacity.

Figure 28:
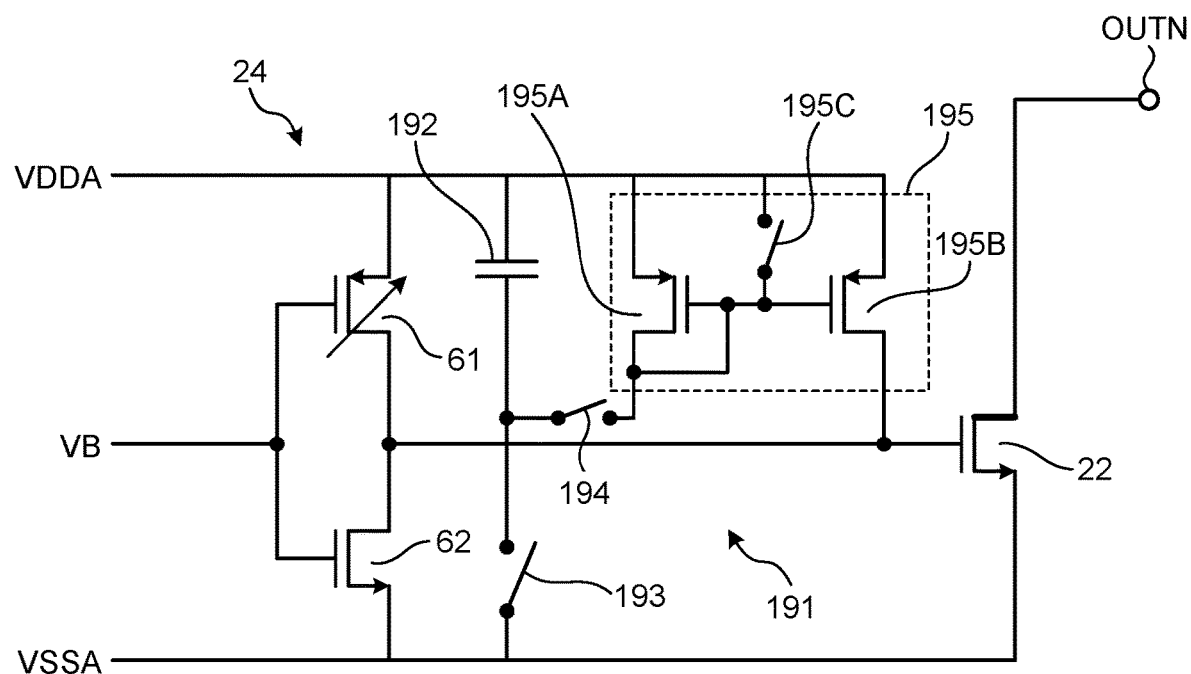
FIG. 28 is a basic configuration explanatory diagram of a fifth embodiment.

FIG. 28 is a basic configuration explanatory diagram of a fifth embodiment. In FIG. 28, the same reference numerals are assigned to the same portions as those in FIG. 3. In FIG. 28, the first variable amplifier 24 includes a driving force variable P-channel MOS transistor 61 and an N-channel MOS transistor 62. The driving force variable P-channel MOS transistor 61 includes a source terminal connected to a high-potential-side power supply VDDA, a drain terminal connected to the gate terminal of the N-channel MOS transistor 22, and a gate terminal to which the output signal VB of the first PWM power supply VPWMH is input. The N-channel MOS transistor 62 includes a drain terminal connected to the gate terminal of the N-channel MOS transistor 22, a source terminal connected to the low-potential-side power supply VSSA, and a gate terminal to which the output signal VB of the first PWM power supply VPWMH is input.

In FIG. 28, a delay-time adjustment circuit 191 includes a capacitor 192, a precharge switch 193, a charge switch 194, and a current mirror circuit 195. The capacitor 192 includes one end connected to a high-potential-side power supply VDDA. The precharge switch 193 includes one end connected to the other end of the capacitor 192, and the other end connected to the low-potential-side power supply VSSA. The charge switch 194 includes one end connected to the other end of the capacitor 192.

In the above configuration, the current mirror circuit 195 includes a P-channel MOS transistor 195A, a P-channel MOS transistor 195B, and a switch 195C. The P-channel MOS transistor 195A includes a source terminal connected to the high-potential-side power supply VDDA, a drain terminal connected to the other end of the charge switch 194, and a gate terminal connected to the drain terminal. The P-channel MOS transistor 195B includes a source terminal connected to the high-potential-side power supply VDDA, a drain terminal connected to the gate terminal of the N-channel MOS transistor 22, and a gate terminal connected to the gate terminal of the P-channel MOS transistor 195A. The switch 195C includes one end connected to the high-potential-side power supply VDDA, and the other end connected to the gate terminal of the P-channel MOS transistor 195A and the gate terminal of the P-channel MOS transistor 195B.

In this configuration, the P-channel MOS transistor 195B is illustrated as one MOS transistor. However, the P-channel MOS transistor 195B may have a configuration that m (m is an integer of 2 or more) P-channel MOS transistors are connected in parallel, or the gate area of the P-channel MOS transistor 195B is set to m times the gate area of the P-channel MOS transistor 195A. With such configuration, a current, which is m times the current flowing between the source terminal and the drain terminal of the P-channel MOS transistor 195A, can flow. Note that m is a mirror ratio of the current mirror may take a value other than an integer.

In the above configuration, the precharge switch 193 is in the ON state in the entire or part of a period during which the output signal VB of the first PWM power supply VPWMH is at the "H" level. That is, the precharge switch 193 is in the ON state until the capacitor 192 reaches a predetermined voltage.

The charge switch 194 is in the ON state in the entire or part of a period during which the output signal VB of the first PWM power supply VPWMH is at the "L" level. That is, the charge switch 73 is in the ON state until the potential of the gate terminal of the N-channel MOS transistor 22 reaches a predetermined voltage (ideally, the threshold voltage of the N-channel MOS transistor 22).

Figure 29:
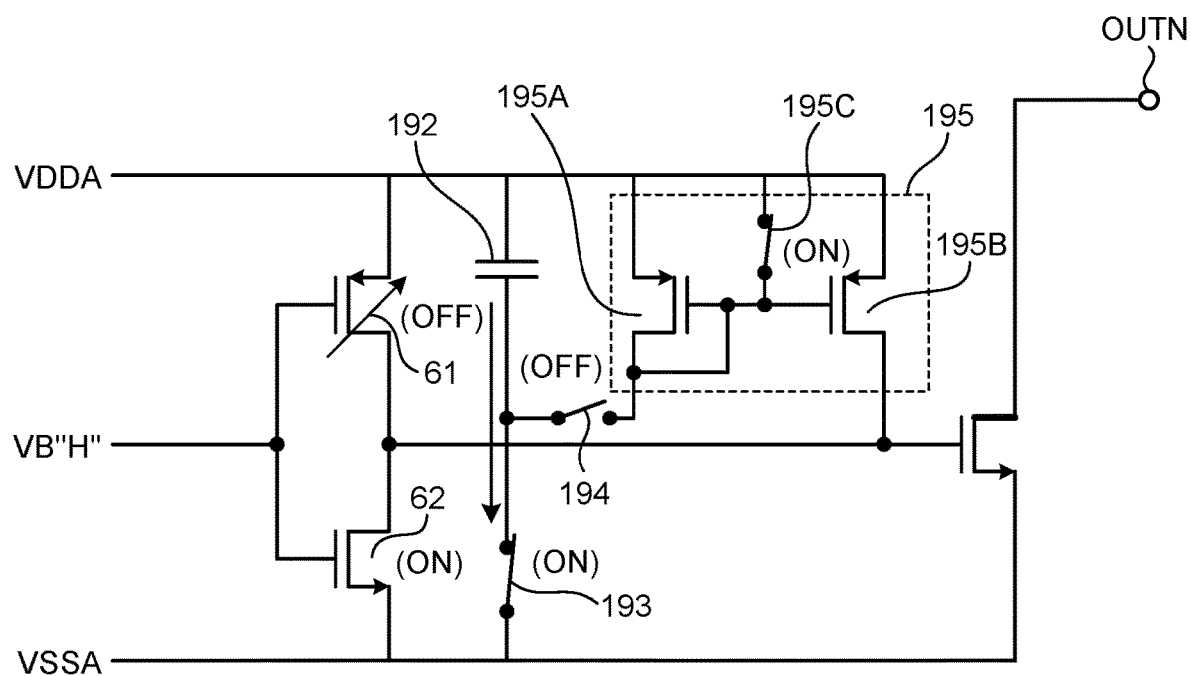
FIG. 29 is an operation explanatory diagram (Part 1) of the fifth embodiment.

Next, an operation of the fifth embodiment will be described. FIG. 29 is an operation explanatory diagram (Part 1) of the fifth embodiment. In a case where the N-channel MOS transistor 22 is caused to transition from the OFF state (open state) to the ON state (closed state), the transistor driver circuit 10 sets the output signal VB of the first PWM power supply VPWMH to the "H" level.

As a result, the P-channel MOS transistor 61 starts to transition to the OFF state (open state), and the N-channel MOS transistor 62 starts to transition to the ON state (closed state).

In parallel with the above operation, since the output signal VB="H" level, the precharge switch 193 enters the ON state, and a charging current flows through the capacitor 192 from the high-potential-side power supply VDDA as indicated by the arrow in FIG. 28. As a result, the capacitor 192 is charged up to the potential of the high-potential-side power supply VDDA.

At this time, the switch 195C of the current mirror circuit 195 is in the ON state. Therefore, in the P-channel MOS transistor 195A and the P-channel MOS transistor 195B, the potentials between the source terminal and the gate terminal are the same. Therefore, the current mirror circuit 195 does not operate as a current mirror circuit.

When the time for completing the charge of the capacitor 192 has elapsed, the precharge switch 193 enters the OFF state.

Figure 30:
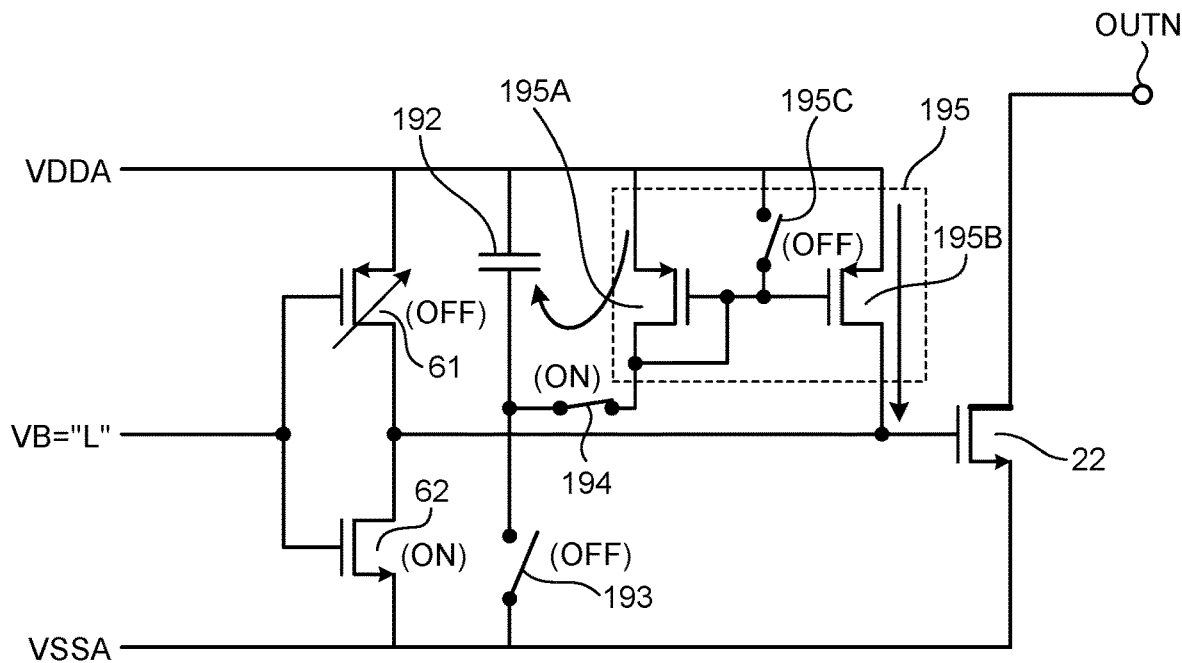
FIG. 30 is an operation explanatory diagram (Part 2) of the fifth embodiment.

FIG. 30 is an operation explanatory diagram (Part 2) of the fifth embodiment. Subsequently, when the output signal VB of the first PWM power supply VPWMH becomes the "L" level, the P-channel MOS transistor 61 starts to transition to the ON state (closed state), and the N-channel MOS transistor 62 starts to transition to the OFF state (open state). In this case, the driving force of the P-channel MOS transistor 61 is limited. Therefore, the potential of the gate of the N-channel MOS transistor 22 gradually transitions to the "H" level.

Therefore, the N-channel MOS transistor 22 does not suddenly transition to the ON state (closed state). As a result, the power transistor at the subsequent stage does not rapidly transition.

In parallel with this, the switch 195C of the current mirror circuit 195 enters the OFF state, and the charge switch 194 enters the ON state. The charge charged in the capacitor 192 flows between the source terminal and the drain terminal of the P-channel MOS transistor 195A constituting the current mirror circuit 195, and a current mirror operation is performed.

That is, a current that is m times the current between the source terminal and the drain terminal of the P-channel MOS transistor 195A flows between the source terminal and the drain terminal of the P-channel MOS transistor 195B constituting the current mirror circuit 195. As a result, the potential of the gate terminal of the N-channel MOS transistor 22 immediately becomes a potential in the vicinity of the voltage corresponding to the threshold voltage Vth of the N-channel MOS transistor 22.

Therefore, a high-speed driving is performed in the period until the gate potential VG of the N-channel MOS transistor 22 reaches the potential near the threshold voltage Vth from 0 volt, and the driving force can be controlled without performing feedback control in the driving force limitation period during which the driving force is desired to be limited (period during which the driving force of the N-channel MOS transistor 22 is desired to be limited).

(7) Sixth Embodiment

Figure 31:
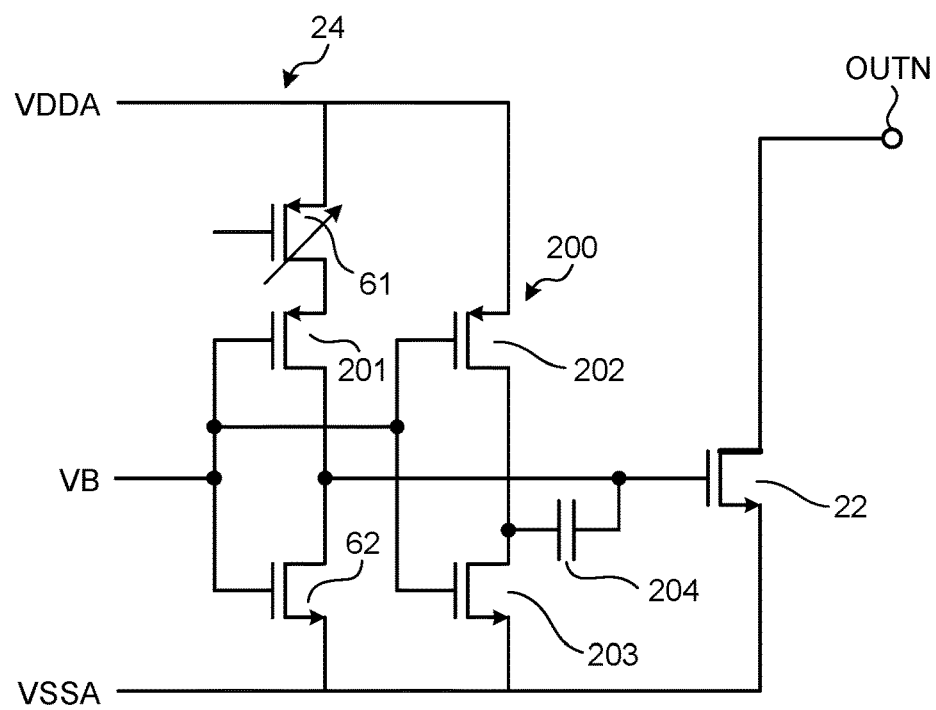
FIG. 31 is a basic configuration explanatory diagram of a sixth embodiment.

FIG. 31 is a basic configuration explanatory diagram of a sixth embodiment. In FIG. 31, the same reference numerals are assigned to the same portions as those in FIG. 3.

In FIG. 31, the first variable amplifier 24 includes the driving force variable P-channel MOS transistor 61, a P-channel (LD) MOS transistor 201, and an N-channel (LD) MOS transistor 62. The driving force variable P-channel MOS transistor 61 includes the source terminal connected to the high-potential-side power supply VDDA. The P-channel (LD) MOS transistor 201 includes a source terminal connected to the drain terminal of the P-channel MOS transistor 61, a drain terminal connected to the gate terminal of the N-channel MOS transistor 22, and a gate terminal receiving the output signal VB of the first PWM power supply VPWMH. The N-channel (LD) MOS transistor 62 includes a drain terminal connected to the drain terminal of the P-channel (LD) MOS transistor 201, a source terminal connected to the low-potential-side power supply VSSA, and a gate terminal connected to the gate terminal of the P-channel (LD) MOS transistor 201.

In FIG. 31, a delay-time adjustment circuit 200 includes a P-channel MOS transistor 202, an N-channel MOS transistor 203, and a capacitor 204. The P-channel MOS transistor 202 includes a source terminal connected to the high-potential side power supply VDDA, and a gate terminal to which the output signal VB of the first PWM power supply VPWMH is input. The N-channel MOS transistor 203 includes a drain terminal connected to the drain terminal of the P-channel MOS transistor 202, a source terminal connected to the low-potential-side power supply VSSA, and a gate terminal connected to the gate terminal of the P-channel MOS transistor 202. The capacitor 204 includes one end connected to the connection point between the drain terminal of the P-channel MOS transistor 201 and the drain terminal of the N-channel MOS transistor 62, and the other end connected to the connection point between the drain terminal of the P-channel MOS transistor 202 and the drain terminal of the N-channel MOS transistor 203.

In the above configuration, the P-channel MOS transistor 202 and the N-channel MOS transistor 203 configure a charging path of the capacitor 204 at a turn-on time of causing the N-channel MOS transistor 22 to transition from the OFF state (open state) to the ON state (closed state) in cooperation with each other.

The P-channel MOS transistor 202 and the N-channel MOS transistor 203 serve as an inverter circuit. The P-channel MOS transistor 202 and the N-channel MOS transistor 203 collaborate with one another to serve as a discharge path of the capacitor 204 at a turn-off time for causing the N-channel MOS transistor 22 to transition from the ON state (closed state) to the OFF state (open state).

Figure 32:
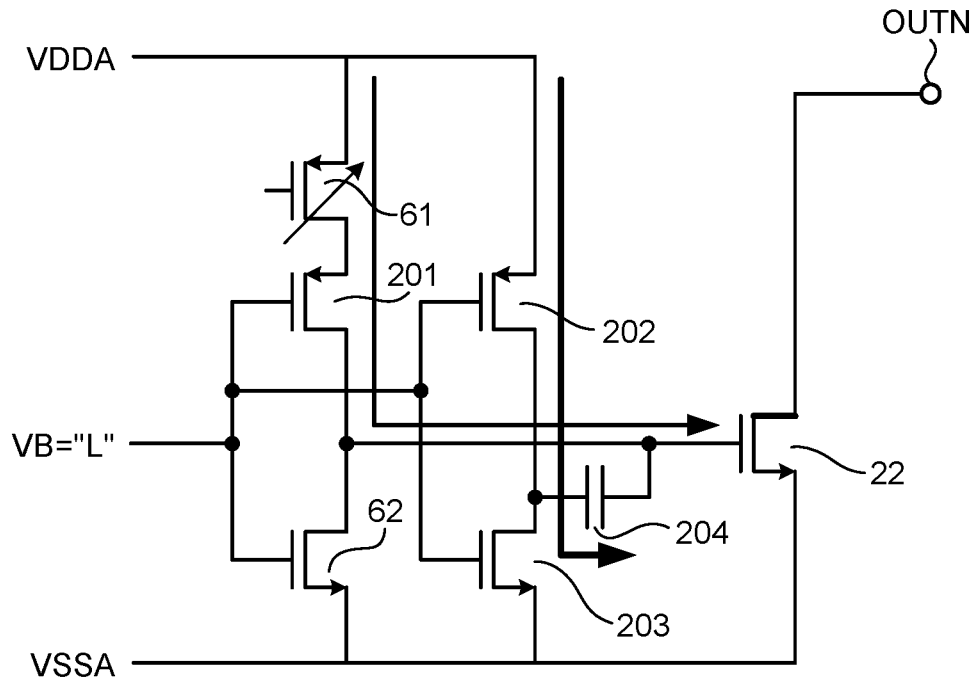
FIG. 32 is an operation explanatory diagram (Part 1) of the sixth embodiment.

Next, an operation of the sixth embodiment will be described. FIG. 32 is an operation explanatory diagram (Part 1) of the sixth embodiment. In a case where the N-channel MOS transistor 22 is caused to transition from the OFF state (open state) to the ON state (closed state), the transistor driver circuit 10 sets the output signal VB of the first PWM power supply VPWMH to the "L" level.

As a result, the P-channel (LD) MOS transistor 201 transitions to the ON state (closed state), and the N-channel MOS transistor 62 transitions to the OFF state (open state). In this case, since the driving force of the P-channel MOS transistor 61 is limited, the potential of the gate of the N-channel MOS transistor 22 gradually transitions to the "H" level.

In parallel with this, the P-channel MOS transistor 202 transitions to the ON state, and the N-channel MOS transistor 203 transitions to the OFF state. Therefore, the P-channel MOS transistor 202 constitutes a charging path for the capacitor 204, and the capacitor 204 is gradually charged.

Therefore, the N-channel MOS transistor 22 does not suddenly transition to the ON state (closed state). As a result, the power transistor at the subsequent stage does not rapidly transition.

Thereafter, charging is completed in the capacitor 204, and the capacitor 204 is charged to a potential in the vicinity of the high-potential-side power supply VDDA, whereby the N-channel MOS transistor 22 enters the ON state (closed state).

Figure 33:
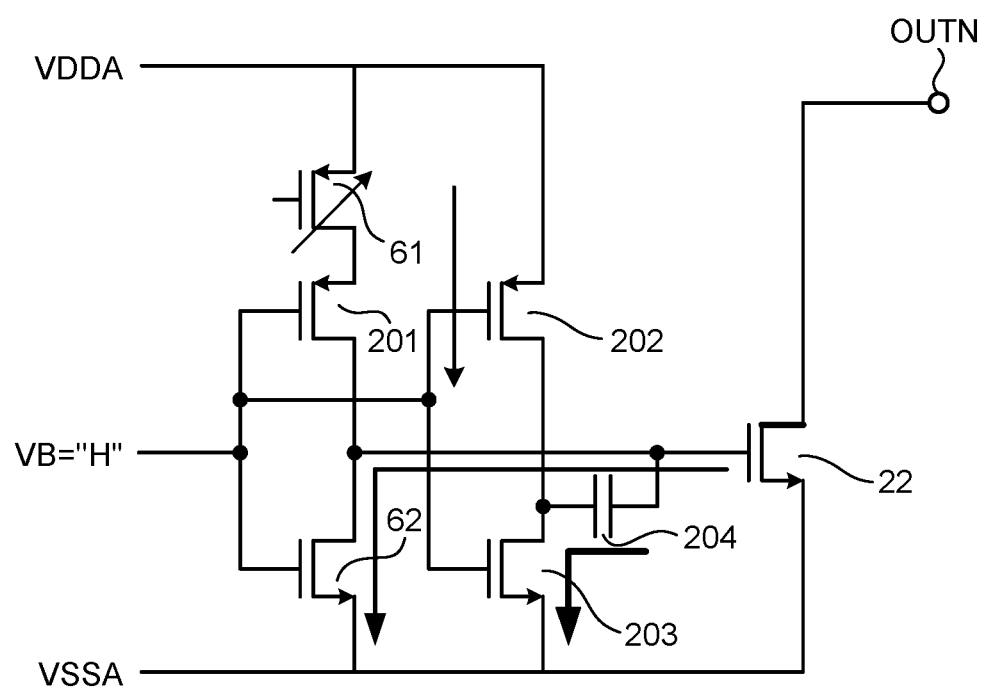
FIG. 33 is an operation explanatory diagram (Part 2) of the sixth embodiment.

FIG. 33 is an operation explanatory diagram (Part 2) of the sixth embodiment. In a case where the N-channel MOS transistor 22 is caused to transition from the ON state (closed state) to the OFF state (open state), the transistor driver circuit 10 sets the output signal VB of the first PWM power supply VPWMH to the "H" level.

As a result, the P-channel (LD) MOS transistor 201 transitions to the OFF state (open state), and the N-channel MOS transistor 62 transitions to the ON state (closed state). In parallel with this, the P-channel MOS transistor 202 transitions to the OFF state, and the N-channel MOS transistor 203 transitions to the ON state. Therefore, the N-channel MOS transistor 203 constitutes a discharging path for the capacitor 204, and the capacitor 204 is quickly discharged.

With this configuration, the N-channel MOS transistor 22 is caused to quickly transition to the OFF state (open state). As a result, the power transistor at the subsequent stage can be rapidly caused to transition. Thereafter, when discharging progresses in the capacitor 204, the N-channel MOS transistor 22 enters the OFF state (open state).

In this manner, according to the sixth embodiment, it is possible to drive at a high speed in a period until the gate potential VG of the N-channel MOS transistor 22 becomes a potential in the vicinity of the threshold voltage Vth from 0 volt while reducing the operation delay. Therefore, driving force control can be performed without performing feedback control for the driving force limitation period during which the driving force is desired to be limited (period during which the driving force of the N-channel MOS transistor 22 is desired to be limited).

While certain embodiments have been described, these embodiments have been presented by way of example only, and are not intended to limit the scope of the inventions. Indeed, the novel embodiments described herein may be embodied in a variety of other forms; moreover, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A transistor driver circuit comprising:
    a driving force limitation circuit configured to maintain a gate potential of a transistor to be driven at a driving force limitation potential when the transistor to be driven is driven, the driving force limitation potential corresponding to a threshold voltage of the transistor to be driven; and
    a delay-time adjustment circuit configured to cause the gate potential to transition to the driving force limitation potential when the driving force limitation circuit is in operation,
    wherein the driving force limitation circuit includes a driving-force variable, first MOS transistor, and a driving-force constant, second MOS transistor connected in series with the first MOS transistor.

2. The transistor driver circuit according to claim 1, wherein the delay-time adjustment circuit includes:
    a capacitor configured to store a charge corresponding to the driving force limitation potential;
    a precharge switch configured to, before the transition of the gate potential to the driving force limitation potential is performed, supply a charge from a power supply to the capacitor or supply a charge of the capacitor to the power supply; and
    a charge switch configured to electrically connect the capacitor to a gate of the transistor to be driven when the transition of the gate potential to the driving force limitation potential is performed.

3. The transistor driver circuit according to claim 1, wherein the delay-time adjustment circuit includes:
    a capacitor configured to store a charge corresponding to the driving force limitation potential; and
    a precharge pump circuit configured to, before the transition of the gate potential to the driving force limitation potential is performed, transfer a charge from a power supply to the capacitor or transfer a charge of the capacitor to the power supply.

4. The transistor driver circuit according to claim 2, wherein the capacitor is a variable capacitance capacitor.

5. The transistor driver circuit according to claim 2, wherein the capacitor is a variable capacitance capacitor, the variable capacitance capacitor being implemented by one or more capacitors selected from among capacitors connected in parallel.

6. The transistor driver circuit according to claim 2, wherein the transistor driver circuit is configured to control a period of supplying the charge from the power supply to the capacitor or a period of supplying the charge of the capacitor to the power supply, on the basis of a result of comparison between a potential of the capacitor and a predetermined reference potential.

7. The transistor driver circuit according to claim 2, further comprising a timer configured to cause the capacitor to operate as a variable capacitance capacitor by setting a time to supply the charge from the power supply to the capacitor or a time to supply the charge of the capacitor to the power supply.

8. The transistor driver circuit according to claim 2, wherein the precharge switch is a current capacity variable switch.

9. The transistor driver circuit according to claim 2, wherein a control circuit for the precharge switch and the charge switch is an inverter.

10. The transistor driver circuit according to claim 2, wherein a control circuit for the precharge switch and the charge switch is a non-overlapping clock generation circuit.

11. A transistor driver circuit comprising:
    a driving force limitation circuit configured to maintain a gate potential of a transistor to be driven at a driving force limitation potential when the transistor to be driven is driven, the driving force limitation potential corresponding to a threshold voltage of the transistor to be driven; and
    a delay-time adjustment circuit configured to cause the gate potential to transition to the driving force limitation potential when the driving force limitation circuit is in operation,
    wherein the delay-time adjustment circuit includes:
    a capacitor configured to store a charge corresponding to the driving force limitation potential;

a precharge switch configured to, before the transition of the gate potential to the driving force limitation potential is performed, supply a charge from a power supply to the capacitor or supply a charge of the capacitor to the power supply;

a current mirror circuit configured to receive a current from the capacitor as a reference current, and electrically output an output current that is m times the reference current (where m is a number greater than 1) to a gate of the transistor to be driven; and a charge switch configured to supply a current from the capacitor to the current mirror circuit as the reference current when the transition of the gate potential to the driving force limitation potential is performed.

12. A transistor driver circuit comprising:

a driving force limitation circuit configured to maintain a gate potential of a transistor to be driven at a driving force limitation potential when the transistor to be driven is driven, the driving force limitation potential corresponding to a threshold voltage of the transistor to be driven; and a delay-time adjustment circuit configured to cause the gate potential to transition to the driving force limitation potential when the driving force limitation circuit is in operation, wherein the delay-time adjustment circuit includes:

a capacitor configured to store a charge corresponding to the driving force limitation potential; and an inverter circuit configured to, before the transition of the gate potential to the driving force limitation potential is performed, supply a charge from a power supply to the capacitor or supply a charge of the capacitor to the power supply.

* * * * *